(12) United States Patent
Hayashi

(10) Patent No.: US 8,737,160 B2
(45) Date of Patent: May 27, 2014

(54) SEMICONDUCTOR DEVICE

(76) Inventor: Junichi Hayashi, Tokyo (JP)

( * ) Notice: Subject to any disclaimer, the term of this patent is extended or adjusted under 35 U.S.C. 154(b) by 217 days.

(21) Appl. No.: 13/277,701

(22) Filed: Oct. 20, 2011

(65) Prior Publication Data

US 2012/0114086 A1    May 10, 2012

(30) Foreign Application Priority Data

Nov. 4, 2010   (JP) ................... 2010-247353

(51) Int. Cl.
*G11C 8/00*    (2006.01)

(52) U.S. Cl.
USPC ................. 365/233.1; 365/51; 365/194

(58) Field of Classification Search
USPC .......... 365/51, 194, 233.1, 63, 198, 193, 365/230.08, 189.01, 189.05, 230.03, 200, 365/52, 226, 222
See application file for complete search history.

(56) References Cited

U.S. PATENT DOCUMENTS

| | | | |
|---|---|---|---|
| 5,548,748 A * | 8/1996 | Fuse | 713/401 |
| 7,466,577 B2 | 12/2008 | Sekiguchi et al. | |
| 7,489,030 B2 | 2/2009 | Shibata et al. | |
| 8,054,871 B2 * | 11/2011 | Saen et al. | 375/219 |
| 2007/0291557 A1 * | 12/2007 | Nishio et al. | 365/193 |

FOREIGN PATENT DOCUMENTS

| | | |
|---|---|---|
| JP | 2006-277870 A | 10/2006 |
| JP | 2007-158237 A | 6/2007 |

\* cited by examiner

*Primary Examiner* — Son Dinh
*Assistant Examiner* — Uyen B Tran

(57) ABSTRACT

A semiconductor device includes: an interface chip including a read timing control circuit that outputs, in response to a command signal and a clock signal supplied from the outside, a plurality of read control signals that are each in synchronization with the clock signal and have different timings; and core chips including a plurality of internal circuits that are stacked on the interface chip and each perform an operation indicated by the command signal in synchronization with the read control signals. According to the present invention, it is unnecessary to control latency in the core chips and therefore to supply the clock signal to the core chips.

19 Claims, 18 Drawing Sheets

SEMICONDUCTOR DEVICE

BACKGROUND OF THE INVENTION

1. Field of the Invention

The present invention relates to a semiconductor device, and particularly to a semiconductor device in which a front-end portion having an interface function and a back-end portion containing a memory core are integrated onto separate semiconductor chips.

2. Description of Related Art

A storage capacity required for a semiconductor memory device, such as DRAM (Dynamic Random Access Memory), has been growing over years. To meet the requirement, in recent years, a memory device called multichip package, in which a plurality of memory chips is stacked, has been proposed. However, memory chips used in the multichip package are typical, stand-alone memory chips. Therefore, the memory chips each contain a front-end portion that provides an interface with an external section (which is for example a memory controller). Accordingly, an occupied space that can be allocated to a memory core in each memory chip is limited to an area that is calculated by subtracting the occupied space of the front-end portion from the total area of the chip. Therefore, it is difficult to dramatically increase the storage capacity per chip (or per memory chip).

Another problem is that even though a circuit that makes up the front-end portion is a logic circuit, the back-end portion containing a memory core is produced at the same time as the front-end portion, making it difficult to speed up a transistor of the front-end portion.

The following method is proposed as a solution to the problems that a front-end portion and a back-end portion are integrated onto separate chips, and the chips are stacked in order to make one semiconductor memory device (see Japanese Patent Application Laid-Open No. 2007-158237). According to the method, on a core chip where the back-end portion is integrated, an occupied space that can be allocated to a memory core increases. Therefore, it is possible to increase the storage capacity per chip (or per core chip). Meanwhile, an interface chip where the front-end portion is integrated can be produced in a different process from that of the memory core. Therefore, it is possible to form a circuit using a high-speed transistor. Moreover, a plurality of core chips can be allocated to one interface chip. Thus, it is possible to provide an extremely large-capacity, high-speed semiconductor memory device as a whole.

In a semiconductor device such as DRAM, an internal control signal is generated by decoding a command issued from an external controller. On the basis of the internal control signal, various operations, which for example include activation of a word line, column switch or data amplifier and the like, are performed. The timings of the operations are controlled with the use of a clock signal. Accordingly, various circuit blocks are each activated at the most appropriate timings. In one example, when a read command is issued, a column switch is then activated at a predetermined timing. After that, a data amplifier is activated at a predetermined timing. As a result, read data are read out from a memory cell array.

In recent years, for a DRAM, a Posted CAS method has been employed so that a column-related command, such as read command, is issued prior to an original issuing timing. In a DRAM that uses the Posted CAS method, after a column-related command, such as read command, is issued, an internal control signal is latched in a chip. After being delayed by a period of additive latency (AL), the internal control signal is supplied to various circuit blocks. Such latency control has been performed even in each memory chip of a stacked semiconductor device (see Japanese Patent Application Laid-Open No. 2006-277870).

However, in order for latency control to be performed in each memory chip of a stacked semiconductor device, each memory chip needs to be provided with a latency counter that counts the latency. Therefore, the problem is that the chip area of a memory chip increases.

Moreover, a clock signal needs to be supplied to each memory chip to operate the latency counter. The clock signal is very short in signal width compared with various internal control signals. Therefore, for example, when the clock signal is commonly supplied from an interface chip to a plurality of core chips, parasitic capacitance components and parasitic resistance components of a clock line could distort the waveform, possibly making it difficult to count the latency.

In particular, as in the semiconductor device disclosed in Japanese Patent Application Laid-Open No. 2007-158237, in a semiconductor device of a type that transmits a signal using a through silicon via, a parasitic capacitance component of the through silicon via is relatively large. As a result, the above problems become more serious. Even when a resistance value of the through silicon via is higher than a design value for some reason, the above problems become more serious.

SUMMARY

In one embodiment, there is provided a semiconductor device that includes: a first chip including a timing control circuit that outputs, in response to a first command signal and a clock signal supplied from outside, a plurality of second command signals having different timings from each other in synchronization with the clock signal; and a second chip stacked on the first chip including a plurality of internal circuits, each of the internal circuits performing an operation indicated by the first command signal in synchronization with corresponding one of the second command signals.

In another embodiment, there is provided a semiconductor device that includes: an interface chip to which an address signal and a first command signal are supplied from outside; and a plurality of core chips to which different chip addresses are assigned, respectively, wherein the interface chip includes a first command delay circuit generating a second command signal by delaying the first command signal, and a first chip address delay circuit generating a second chip address by delaying a first chip address, the interface chip commonly supplying the second command signal and the second chip address to the core chips, and each of the core chips includes a first judgment circuit activating a first matching signal when the second chip address matches a chip address assigned to the core chips, and a first internal circuit performing an operation in synchronization with the second command signal when the first matching signal is activated.

According to the present invention, in the first chip (interface chip) that receives the first command signal, the first command signal is delayed to generate the second command signal. The generated second command signal is supplied to the second chip (core chip). Therefore, there is no need to provide a circuit that delays the first command signal in the second chip. Accordingly, it is unnecessary to supply the clock signal from the first chip to the second chip. Therefore, particularly in a semiconductor device of a type that uses a through silicon via to interconnect a plurality of chips, it is possible to solve the above problems.

BRIEF DESCRIPTION OF THE DRAWINGS

The above and other features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
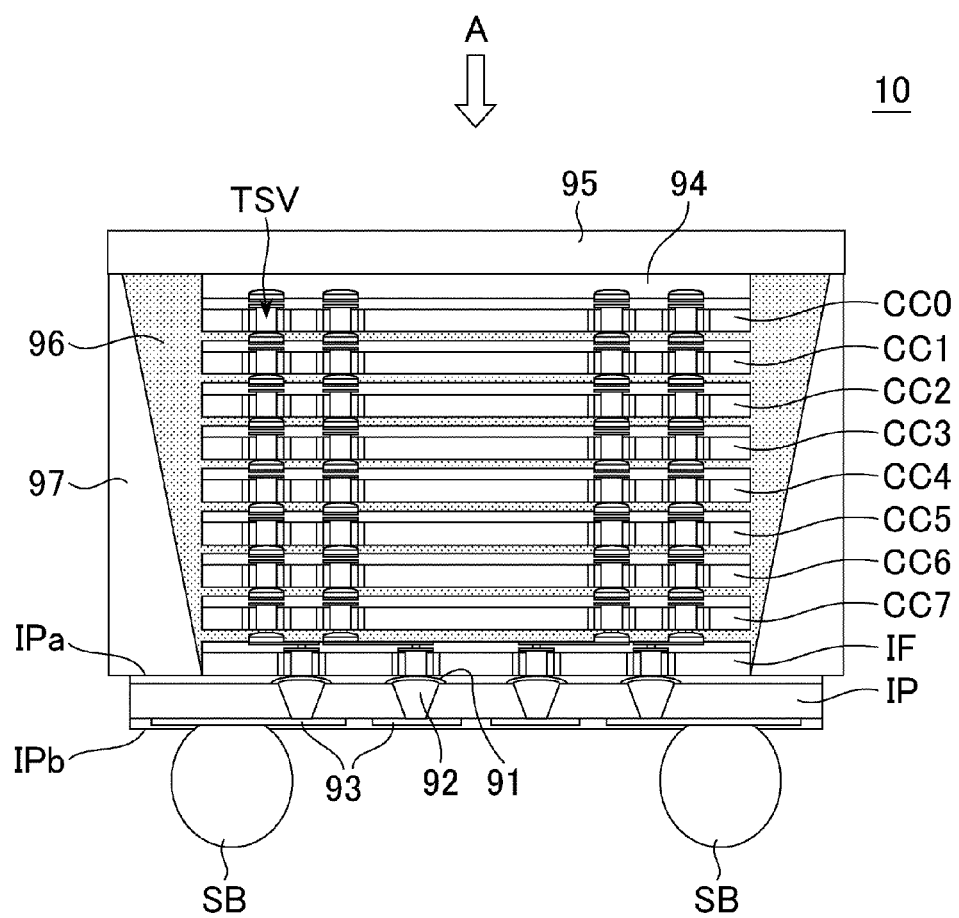
FIG. 1 is a schematic cross-sectional view provided to explain the structure of a semiconductor device 10 according to the preferred embodiment of the present invention.

FIG. 1 is a schematic cross-sectional view provided to explain the structure of a semiconductor device 10 according to the preferred embodiment of the present invention.

As shown in FIG. 1, the semiconductor device 10 according to this embodiment has the structure where 8 core chips CC0 to CC7 that have the same function and structure and are manufactured using the same manufacture mask, an interface chip IF that is manufactured using a manufacture mask different from that of the core chips CC0 to CC7 and an interposer IP are laminated. The core chips CC0 to CC7 and the interface chip IF are semiconductor chips using a silicon substrate and are electrically connected to adjacent chips in a vertical direction through plural Through Silicon Vias (TSV) penetrating the silicon substrate. The through silicon via may be referred to as a penetration electrode. Meanwhile, the interposer IP is a circuit board that is made of a resin, and plural external terminals (solder balls) SB are formed in a back surface IPb of the interposer IP.

The core chips CC0 to CC7 are semiconductor chips from which a so-called front-end portion, which performs an interface with an outside, of circuit blocks included in a normal stand-alone SDRAM (Synchronous Dynamic Random Access Memory), is removed. That is, each of the core chips CC0 to CC7 is a semiconductor chip where only the circuit blocks belonging to the back end unit are integrated in principle. As the circuit blocks that are included in the front end unit, a parallel-serial converting circuit that performs parallel/serial conversion on input/output data between a memory cell array and a data input/output terminal and a DLL (Delay Locked Loop) circuit that controls input/output timing of data are exemplified, which will be described in detail below.

On the other hand, the interface chip IF is a semiconductor chip on which only the front-end portion of the circuit blocks included in the normal stand-alone SDRAM is integrated. The interface chip IF functions as a front-end portion common to 8 core chips CC0 to CC7. Accordingly, all of the external accesses are made through the interface chip IF, and data input and data output are made through the interface chip IF.

The interface chip IF functions as a common front end unit for the eight core chips CC0 to CC7. Accordingly, all external accesses are performed through the interface chip IF and inputs/outputs of data are also performed through the interface chip IF. In this embodiment, the interface chip IF is disposed between the interposer IP and the core chips CC0 to CC7. However, the position of the interface chip IF is not restricted in particular, and the interface chip IF may be disposed on the core chips CC0 to CC7 and may be disposed on the back surface IPb of the interposer IP. When the interface chip IF is disposed on the core chips CC0 to CC7 in a face-down manner or is disposed on the back surface IPb of the interposer IP in a face-up manner, the through silicon via TSV does not need to be provided in the interface chip IF. The interface chip IF may be disposed to be interposed between the two interposers IP.

The interposer IP functions as a rewiring substrate to increase an electrode pitch and secures mechanical strength of the semiconductor device 10. That is, an electrode 91 that is formed on a top surface IPa of the interposer IP is drawn to the back surface IPb via a through-hole electrode 92 and the pitch of the external terminals SB is enlarged by the rewiring layer 93 provided on the back surface IPb. In FIG. 1, only the two external terminals SB are shown. In actuality, however, three or more external terminals are provided. The layout of the external terminals SB is the same as that of the DDR3-type SDRAM that is determined by the regulation. Accordingly, the semiconductor memory device can be treated as one DDR3-type SDRAM from the external controller.

As shown in FIG. 1, a top surface of the uppermost core chip CC0 is covered by an NCF (Non-Conductive Film) 94 and a lead frame 95. Gaps between the core chips CC0 to CC7 and the interface chip IF are filled with an underfill 96 and surrounding portions of the gaps are covered by a sealing resin 97. Thereby, the individual chips are physically protected.

Figure 2A:
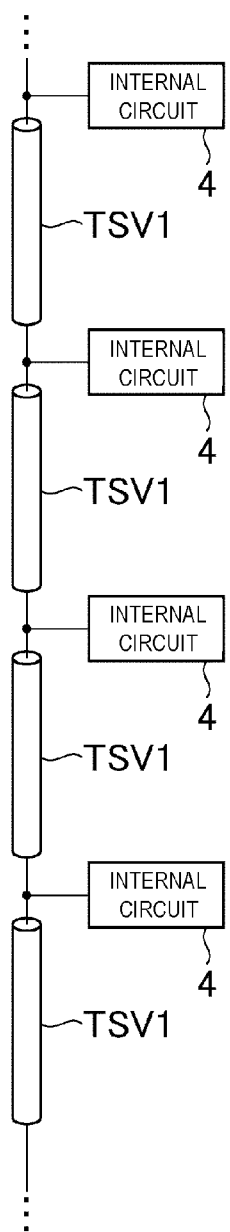
FIGS. 2A to 2C are diagrams showing the various types of through silicon via TSV provided in a core chip.

When most of the through silicon vias TSV provided in the core chips CC0 to CC7 are two-dimensionally viewed from a lamination direction, that is, viewed from an arrow A shown in FIG. 1, the through silicon vias TSV are short-circuited from the through silicon vias TSV of other layers provided at the same position. That is, as shown in FIG. 2A, the vertically disposed through silicon vias TSV1 that are provided at the same position in plain view are short-circuited, and one wiring line is configured by the through silicon via TSV1. The through silicon via TSV1 that are provided in the core chips CC0 to CC7 are connected to internal circuits 4 in the core chips, respectively. Accordingly, input signals (command signal, address signal, etc.) that are supplied from the interface chip IF to the through silicon vias TSV1 shown in FIG. 2A are commonly input to the internal circuits 4 of the core chips CC0 to CC7. Output signals (data etc.) that are supplied from the core chips CC0 to CC7 to the through silicon via TSV1 are wired-ORed and input to the interface chip IF.

Figure 2B:
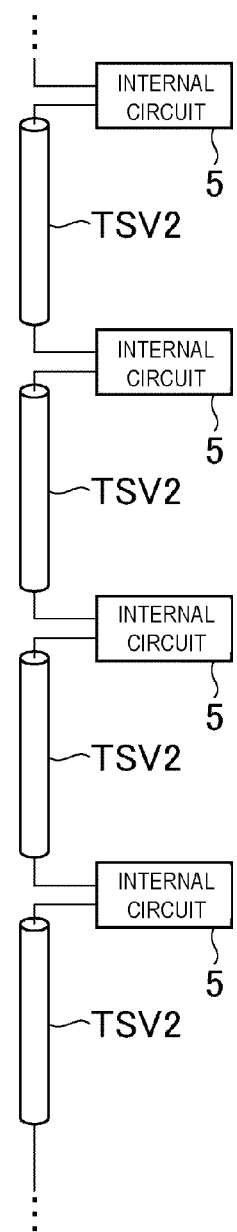

Meanwhile, as shown in FIG. 2B, the apart of the through silicon vias TSV are not directly connected to the through silicon via TSV2 of other layers provided at the same position in plain view but are connected to the through silicon via TSV2 of other layers through the internal circuits 5 provided in the core chips CC0 to CC7. That is, the internal circuits that are provided in the core chips CC0 to CC7 are cascade-connected through the through silicon via TSV2. This kind of through silicon via TSV2 is used to sequentially transmit predetermined information to the internal circuits 5 provided in the core chips CC0 to CC7. As this information, layer address information to be described below is exemplified.

Figure 2C:
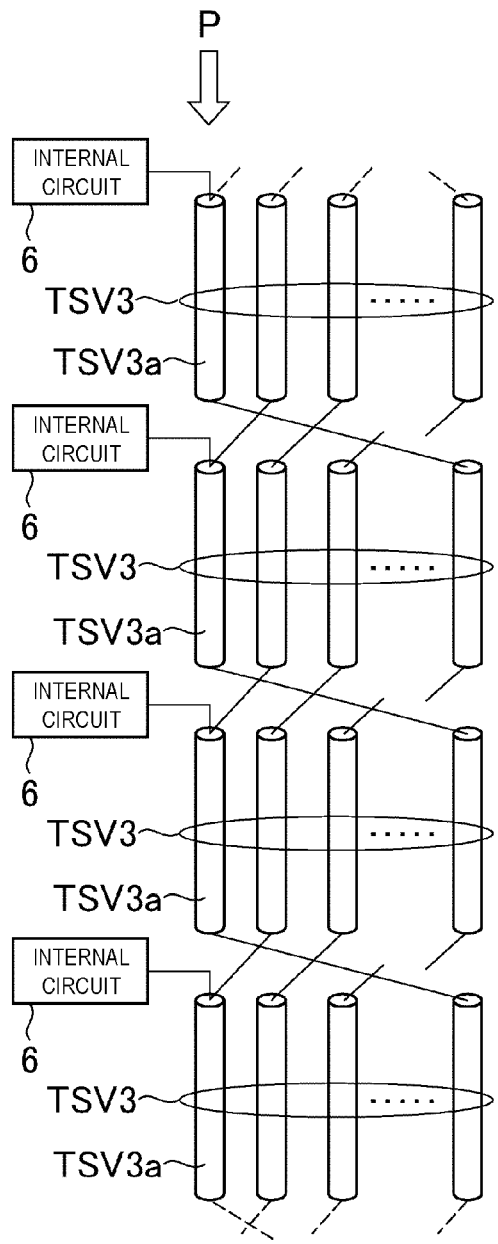

Another part of the through silicon vias TSV is short-circuited from the through silicon vias TSV of other layer provided at the different position in plan view, as shown in FIG. 2C. With respect to this kind of through silicon vias TSV group 3, internal circuits 6 of the core chips CC0 to CC7 are connected to the through silicon via TSV3a provided at the predetermined position P in plain view. Thereby, information can be selectively input to the internal circuits 6 provided in the core chips. As this information, defective chip information to be described below is exemplified.

As such, as types of the through silicon vias TSV provided in the core chips CC0 to CC7, three types (TSV1 to TSV3) shown in FIGS. 2A to 2C exist. As described above, most of the through silicon vias TSV are of a type shown in FIG. 2A, and an address signal and a command signal, and the like are supplied from the interface chip IF to the core chips CC0 to CC7, through the through silicon via TSV1 of the type shown in FIG. 2A. Read data and write data are input to and output from the interface chip IF through the through silicon via TSV1 of the type shown in FIG. 2A. Meanwhile, the through silicon vias TSV2 and TSV3 of the types shown in FIGS. 2B and 2C are used to provide individual information to the core chips CC0 to CC7 having the same structure.

Figure 3:
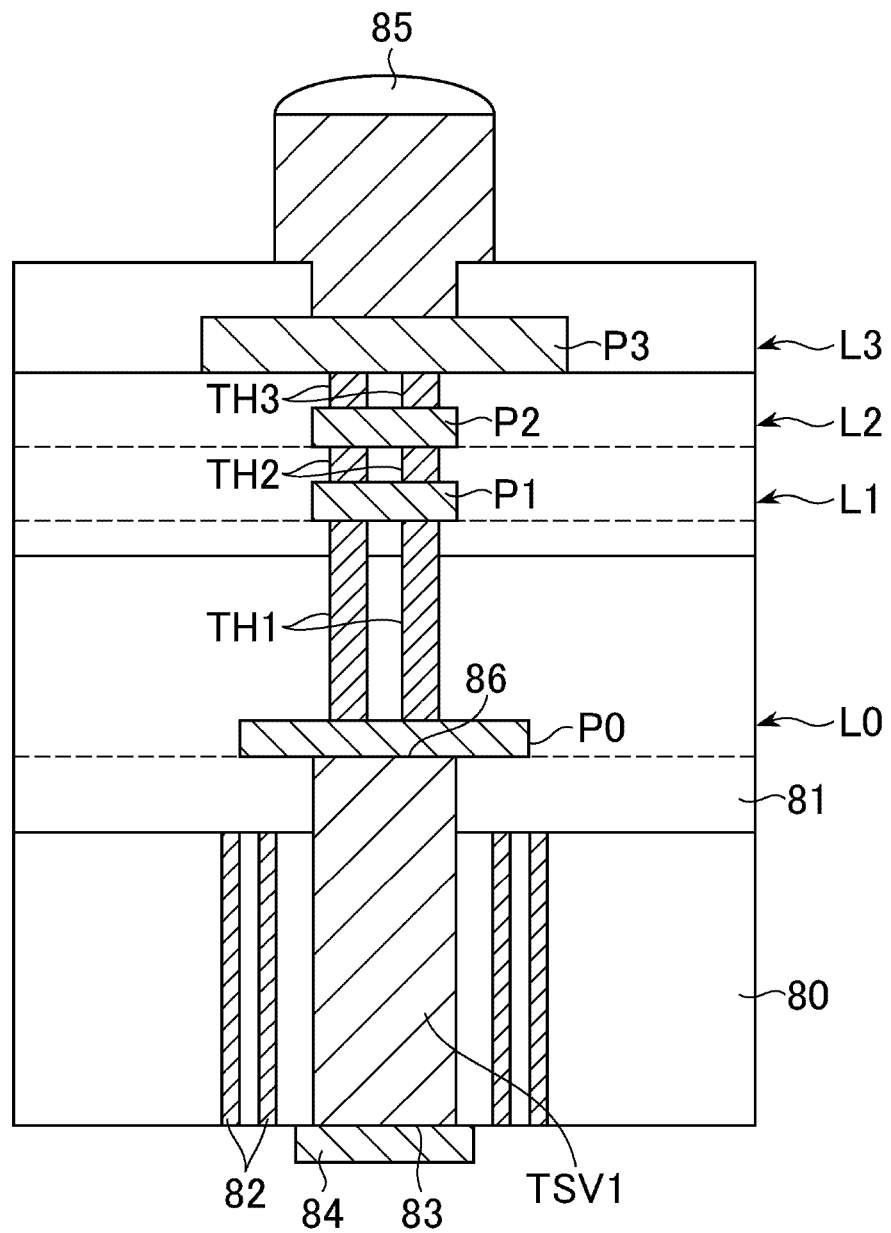
FIG. 3 is a cross-sectional view illustrating the structure of the through silicon via TSV of the type shown in FIG. 2A.

FIG. 3 is a cross-sectional view illustrating the structure of the through silicon via TSV1 of the type shown in FIG. 2A.

As shown in FIG. 3, the through silicon via TSV1 is provided to penetrate a silicon substrate 80 and an interlayer insulating film 81 provided on a surface of the silicon substrate 80. Around the through silicon via TSV1, an insulating ring 82 is provided. Thereby, the through silicon via TSV1 and a transistor region are insulated from each other. In an example shown in FIG. 3, the insulating ring 82 is provided double. Thereby, capacitance between the through silicon via TSV1 and the silicon substrate 80 is reduced.

An end 83 of the through silicon via TSV1 at the back surface of the silicon substrate 80 is covered by a back surface bump 84. The back surface bump 84 is an electrode that contacts a surface bump 85 provided in a core chip of a lower layer. The surface bump 85 is connected to an end 86 of the through silicon via TSV1, through plural pads P0 to P3 provided in wiring layers L0 to L3 and plural through-hole electrodes TH1 to TH3 connecting the pads to each other. Thereby, the surface bump 85 and the back surface bump 84 that are provided at the same position in plain view are short-circuited. Connection with internal circuits (not shown in the drawings) is performed through internal wiring lines (not shown in the drawings) drawn from the pads P0 to P3 provided in the wiring layers L0 to L3.

Before detailed circuit structures of the interface chip IF and the core chips CC0 to CC7 are described, an address allocation in a semiconductor device 10 according to the present embodiment will be described.

The semiconductor device 10 according to the present embodiment can change the address allocation by a mode selection. There are roughly prepared an LRA (Logical Rank Address) system and a PRA (Physical Rank Address) system in the semiconductor device 10. The LRA system is an address allocation system in which plural banks mounted to the different core chips CC0 to CC7, respectively, are handled as one bank by a controller. On the other hand, the PRA system is an address allocation system in which each of the plural banks mounted to the respective core chips CC0 to CC7 is handled as one bank. In the present embodiment, there are three types in the LRA system. Each of three types is referred to as LRA-1 system, LRA-2 system, and LRA-3 system, for the sake of convenience. The respective systems will specifically be described below.

Figure 4:
FIG. 4 is a schematic view for describing an address allocation in LRA-1 system.
Figure 4:

FIG. 4 is a schematic view for describing the address allocation in the LRA-1 system. In FIGS. 4 to 7, one square indicates a bank. Therefore, a single core chip includes banks 0 to 7.

As illustrated in FIG. 4, in the LRA-1 system, any one of the core chips CC0 to CC7 is selected based upon a part of an address signal, which is Xn+2, Xn+1, and Xn (chip address), supplied during a row-access (upon an issuance of an active command ACT), and any one of banks 0 to 7 is selected based upon bank address signals BA0 to BA2 supplied during the row access and a column access. The controller recognizes 8 banks, included in the different core chips CC0 to CC7 and having the same number, as one bank.

In this system, the chip address is not supplied during the column access (upon the issuance of a column command). However, since the controller recognizes 8 banks, included in the different core chips CC0 to CC7 and having the same number, as one bank, the controller can identify to which one of the core chips CC0 to CC7 the column access is made during the column access, even if the chip address is not supplied. Because there is inevitably one core chip in which the bank designated upon the column access is in an active state.

For example, it is supposed that the encircled banks are in the active state in FIG. 4. If the designated bank upon the column access is the bank 0, the column access is made to the core chip CC7 in which the bank 0 is in the active state. If the designated bank upon the column access is the bank 1, the column access is made to the core chip CC5 in which the bank 1 is in the active state.

As described above, the selection of the core chips CC0 to CC7 is made during the row access in the LRA-1 system. The controller recognizes the core chips CC0 to CC7 as one DRAM, so that a chip selection signal (CS) to be used is also 1 bit. Therefore, the number of memory cells accessed by one row access becomes 1 kilobyte, and the number of the rank becomes 1.

Figure 5:
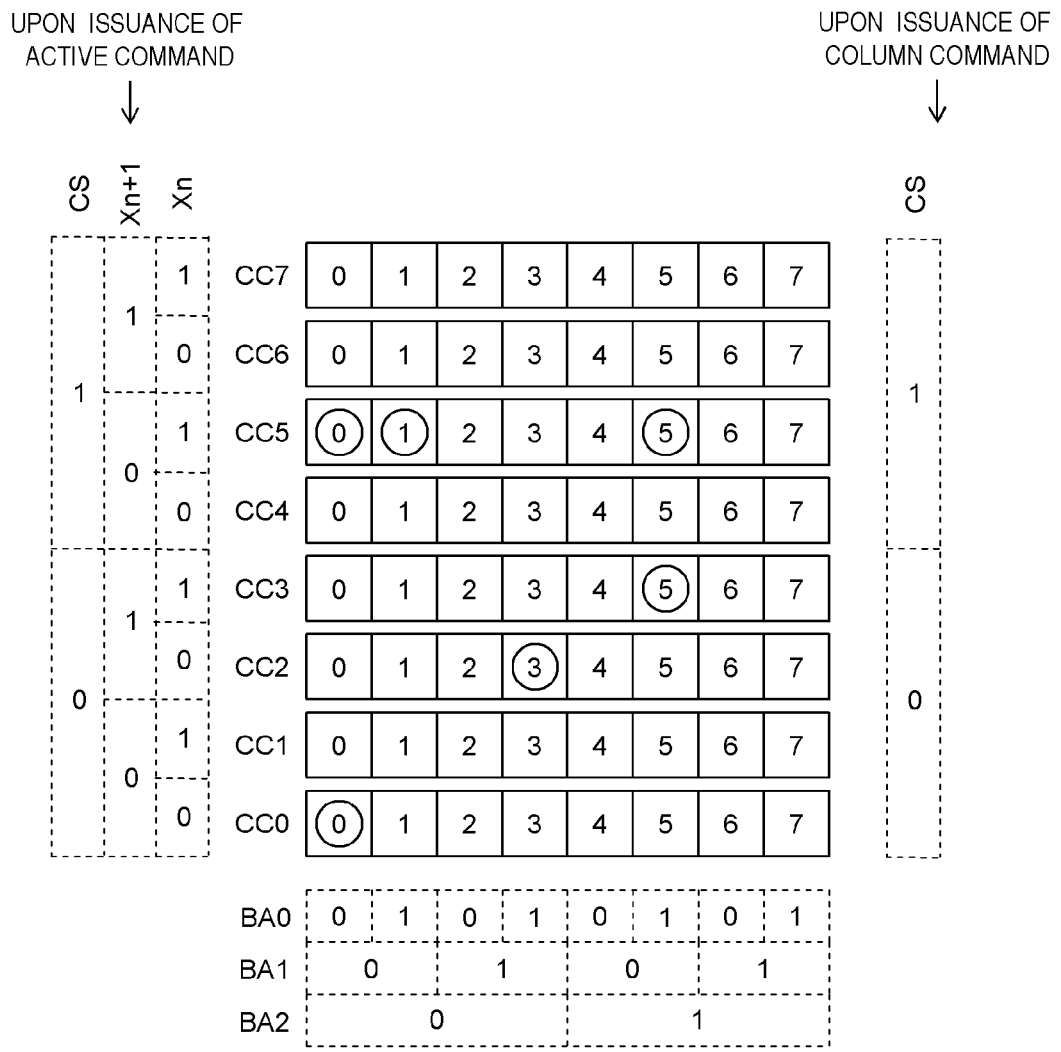
FIG. 5 is a schematic view for describing an address allocation in LRA-2 system.

FIG. 5 is a schematic view for describing the address allocation in the LRA-2 system.

As illustrated in FIG. 5, in the LRA-2 system, the core chips CC0 to CC3 or the core chips CC4 to CC7 are selected based upon chip selection signals CS0 and CS1 of two bits, and any one of selected 4 core chips is selected based upon a part of an address signal, which is Xn+1, and Xn (chip address), supplied during a row-access. The bank address signals BA0 to BA2 are supplied during both the row access and the column access.

In this system, the core chips CC0 to CC3 or the core chips CC4 to CC7 are selected by using the chip selection signals, so that the rank number viewed from the controller becomes 2. Like the LRA-1 system, the selection of the core chips CC0 to CC7 is determined during the row access, so that the number of memory cells accessed by one row access becomes 1 kilobyte, as in the LRA-1 system. Although the chip address is not supplied during the column access, a problem is not caused with this situation, as in the LRA-1 system.

In this system, the core chips CC0 to CC3 and the core chips CC4 to CC7 are identified by the chip selection signals CS0 and CS1. Therefore, the banks belonging to the core chips CC0 to CC3 and the banks belonging to the core chips CC4 to CC7 are handled as different banks by the controller. Accordingly, the bank 0 in the core chip CC2 and the bank 0 in the core chip CC7 can be simultaneously brought into the active state as in the example in FIG. 5.

Figure 6:
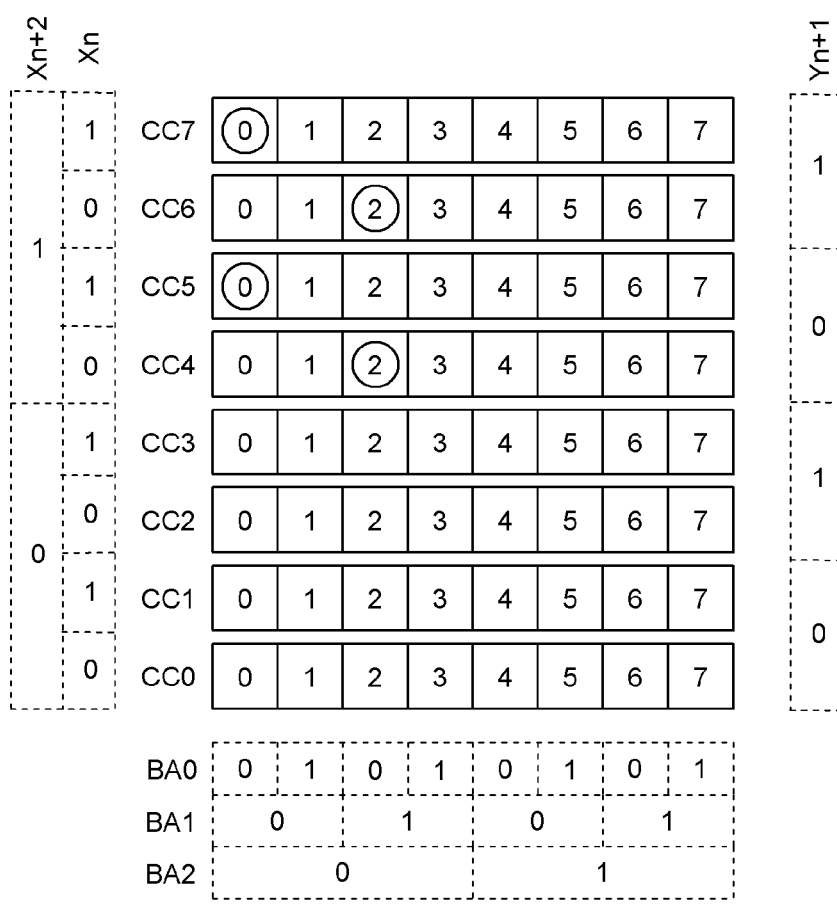
FIG. 6 is a schematic view for describing an address allocation in LRA-3 system.

FIG. 6 is a schematic view for describing the address allocation in the LRA-3 system.

As illustrated in FIG. 6, in the LRA-3 system, any one set of the core chips CC0 and CC2, the core chips CC1 and CC3, the core chips CC4 and CC6, and the core chips CC5 and CC7 is selected based upon a part of the address signals, which is Xn+2 and Xn, supplied during the row access, and either one of the selected two core chips is selected based upon a part of the address signals, which is Yn+1, supplied during the column access. The bank address signals BA0 to BA2 are supplied during both the row access and the column access.

In this system, the selection of the core chips CC0 to CC7 is made based upon the part of the address signals, which is Xn+2 and Xn, supplied during the row access, and a part of the address signals, which is Yn+1, supplied during the column access. Therefore, the chip address becomes Xn+2, Xn, and Yn+1. Since two core chips are in the active state during the row access, the number of memory cells accessed by one row access becomes double that in the LRA-1 system and LRA-2 system. For example, it becomes 2 kilobytes. The rank number is 1, as in the LRA-1 system.

Figure 7:
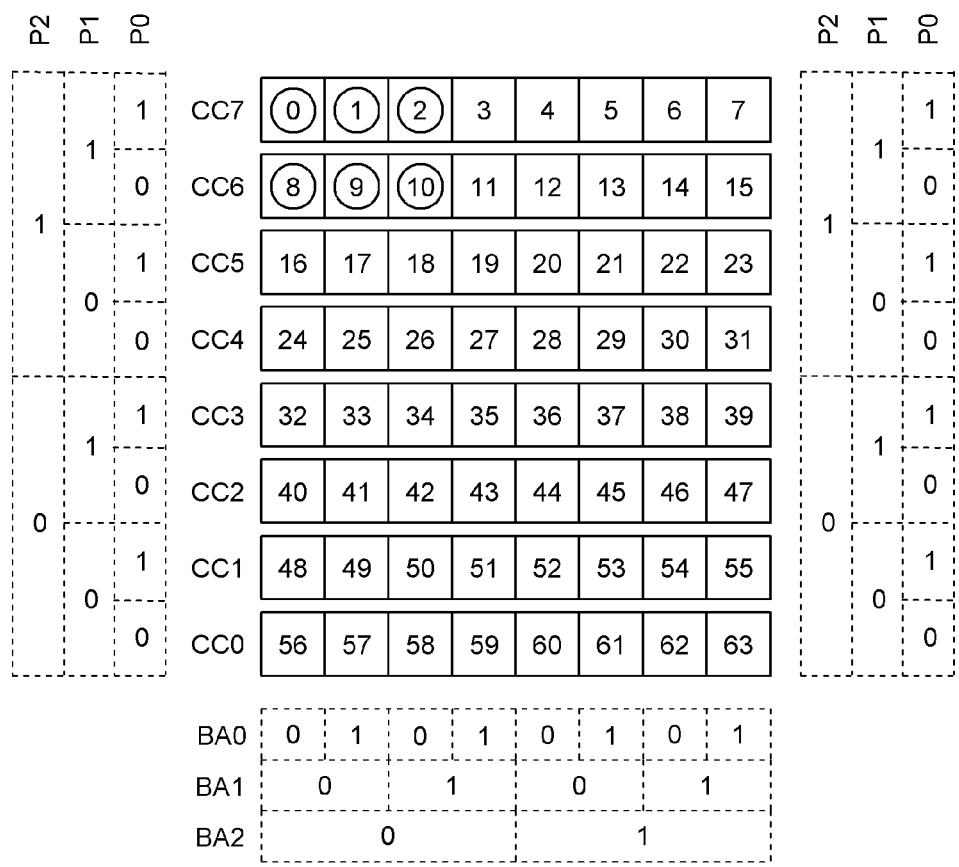
FIG. 7 is a schematic view for describing an address allocation in PRA system.

FIG. 7 is a schematic view for describing the address allocation in the PRA system.

As illustrated in FIG. 7, the PRA system is the one in which chip addresses P2, P1, and P0, which are a part of the address signal, and the bank address signals BA0 to BA2 are supplied during both the row access and the column access. In this system, the controller recognizes all banks as different banks. Specifically, the controller recognizes 64 banks in the present embodiment. Therefore, the number and the combination of the banks, which become the active state, is optional, wherein the maximum of 64 banks can be brought into the active state.

The above description is the detail of the respective address allocation systems. The address allocation systems can be changed by the mode selection.

The following describes the circuit configuration of the semiconductor device 10 in detail. The following description uses an example in which the operation mode of the semiconductor device 10 is set to the PRA system.

Figure 8:
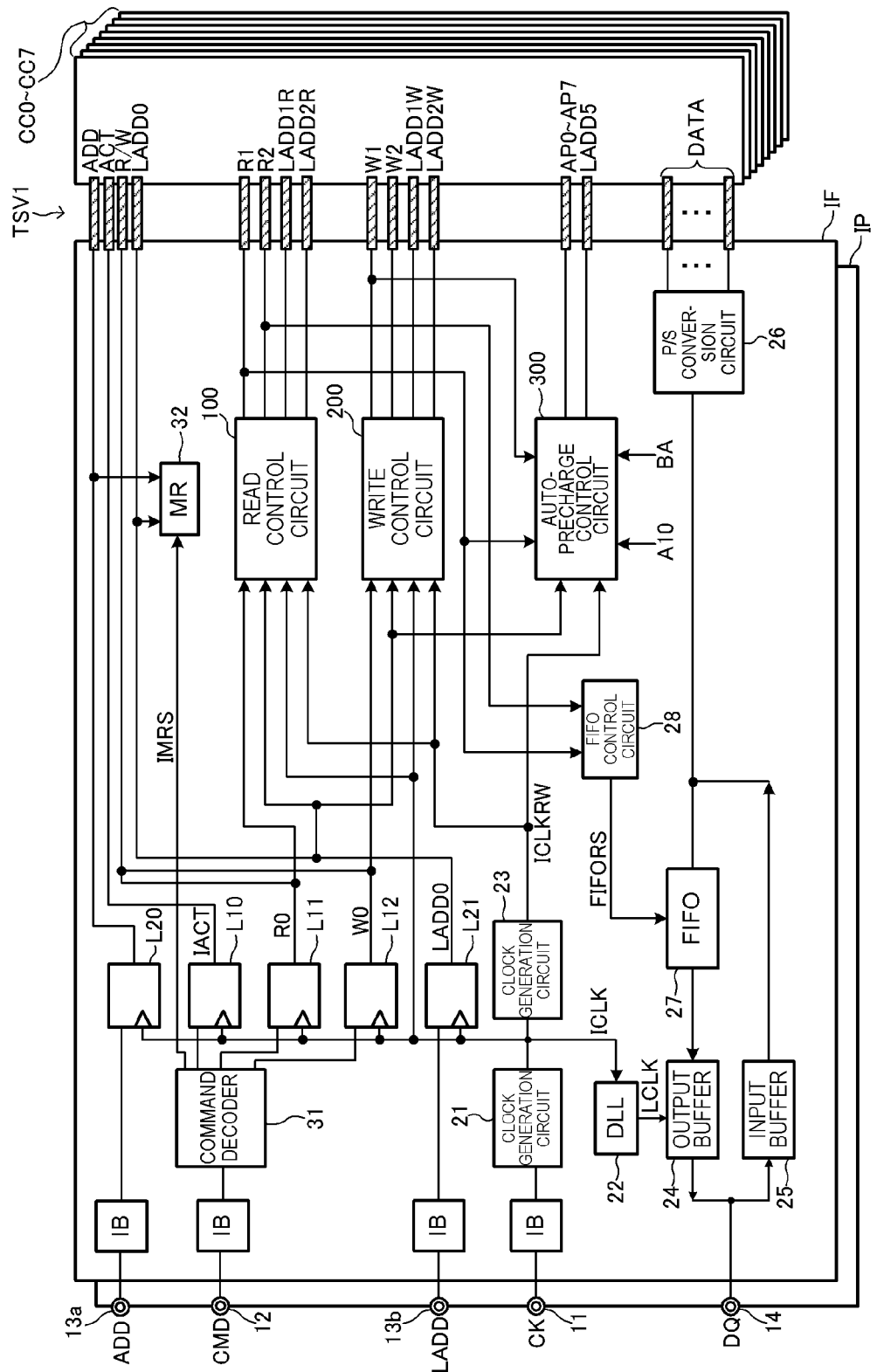
FIG. 8 is a block diagram showing a configuration of an interface chip IF.
Figure 9:
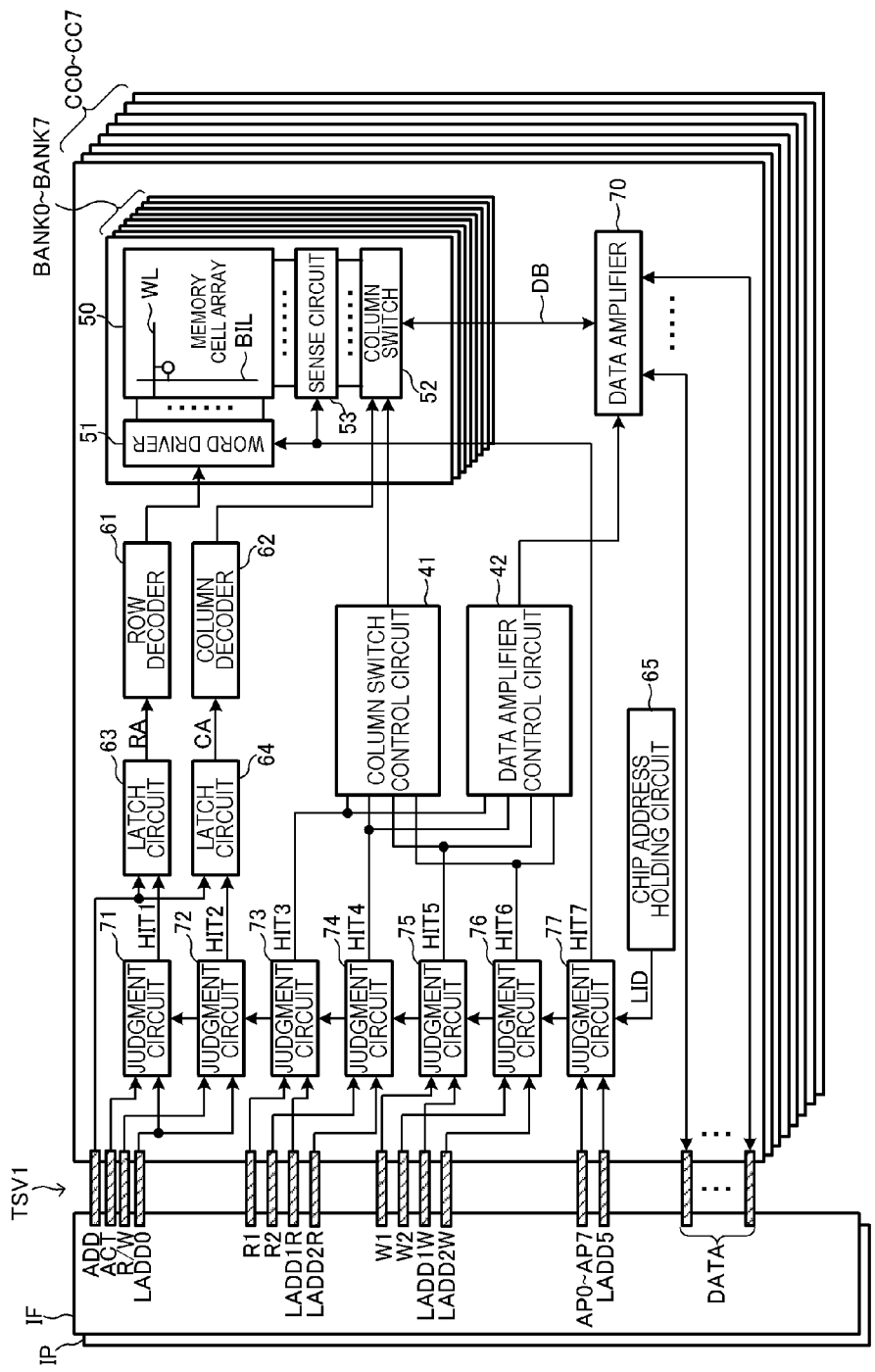
FIG. 9 is a block diagram showing a configuration of core chips CC0 to CC7.

FIGS. 8 and 9 are block diagrams showing the configuration of the semiconductor device according to a preferred embodiment of the present invention. FIG. 8 shows the configuration of the interface chip IF in detail. FIG. 9 shows the configuration of the core chips CC in detail.

As shown in FIG. 8, the external terminals provided in the interposer IP include a clock terminal 11, a command terminal 12, address terminals 13a and 13b, and a data input/output terminal 14. Besides the above terminals, there are a data strobe terminal, calibration terminal, power-supply terminal and the like, which are not shown in the diagrams. Among the above external terminals, all external terminals except the power-supply terminal are connected to the interface chip IF, and not connected directly to the core chips CC0 to CC7.

The clock terminal 11 is a terminal to which an external clock signal CK is supplied. The supplied external clock signal CK is supplied to a clock generation circuit 21 via an input buffer IB. The clock generation circuit 21 generates an internal clock signal ICLK. The generated internal clock signal ICLK is supplied to various circuit blocks in the interface chip IF. According to the present embodiment, the internal clock signal ICLK is not supplied to the core chips CC0 to CC7 through the through silicon vias TSV. The reason is that, as described below, the semiconductor device 10 of the present embodiment uses no clock signal in the core chips CC0 to CC7, which is one important feature of the present invention.

The internal clock signal ICLK is supplied to a DLL circuit 22 and a clock generation circuit 23. The DLL circuit 22 generates an output clock signal LCLK. The generated output clock signal LCLK is supplied to an output buffer circuit 24. The clock generation circuit 23 generates a read/write clock signal ICLKRW, which is used in a column operation. The read/write clock signal ICLKRW is supplied to a read control circuit 100, a write control circuit 200 and an auto-precharge control circuit 300. The read control circuit 100, the write control circuit 200 and the auto-precharge control circuit 300 will be described later in detail. The read control circuit 100, the write control circuit 200 and the auto-precharge control circuit 300 may be referred to as "timing control circuits."

The command terminal 12 is a terminal to which command signals, including the following signals, are supplied: a low address strobe signal /RAS, a column address strobe signal /CAS, a write enable signal /WE, a chip select signal /CS, and an on die termination signal ODT. The above command signals are supplied to a command decoder 31 via an input buffer IB. The command decoder 31 decodes command signals to generate various internal control signals. The internal control signals output from the command decoder 31 include an active control signal IACT, which is output in response to an active command ACT; a read control signal R0, which is output in response to a read command RD; a write control signal W0, which is output in response to a write command WR; and a mode register set control signal IMRS, which is output in response to a mode register set command MRS.

Among the above internal control signals, the active control signal IACT is latched by a latch circuit L10, the read control signal R0 by a latch circuit L11, and the write control signal W0 by a latch circuit L12. The latch circuits L10 to L12 each perform a latch operation in synchronization with the internal clock signal ICLK. The internal control signals latched by the latch circuits L10 to L12 are commonly supplied to the core chips CC0 to CC7 through the through silicon vias TSV. The read control signal R0 latched by the latch circuit L11 is also supplied to the read control circuit 100, and the write control signal W0 latched by the latch circuit L12 to the write control circuit 200. The mode register set control signal IMRS is supplied to a mode register 32.

The address terminal 13a is a terminal to which address signals ADD (A0 to A13) and bank address signals BA0 to BA2 are supplied. The supplied address signals ADD and bank address signals BA0 to BA2 are supplied to a latch circuit L20 via an input buffer IB. The address terminal 13b is a terminal to which chip addresses P0 to P2 are supplied. The supplied chip addresses P0 to P2 are supplied to a latch circuit L21 via an input buffer IB. The chip addresses P0 to P2 are used to select the core chips CC0 to CC7 when being set to a PRA mode, and correspond to high-order bits A14 to A16 of an address signal when being set to an LRA mode. The latch circuits L20 and L21 both perform a latch operation in synchronization with the internal clock signal ICLK.

The addresses latched by the latch circuits L20 and L21 are commonly supplied to the core chips CC0 to CC7 via the through silicon vias TSV, as well as to the mode register 32. Therefore, when the mode register set control signal IMRS is being activated, the contents of the mode register 32 are rewritten by the values of the addresses. The chip addresses P0 to P2 latched by the latch circuit L21 are supplied even to the read control circuit 100, the write control circuit 200 and the auto-precharge control circuit 300. The bank address signals BA0 to BA2 and an address signal A10 are supplied even to the auto-precharge control circuit 300. As shown in FIG. 8, the chip addresses P0 to P2 latched by the latch circuit L21 are referred to as "LADD0."

The data input/output terminal 14 is a terminal to and from which read data DQ or write data DQ are input and output, and is connected to the output buffer circuit 24 and an input buffer circuit 25. The output buffer circuit 24 receives read data, which are supplied via a parallel/serial conversion circuit 26 and a FIFO circuit 27, and outputs the read data to the data input/output terminal 14 in synchronization with the output clock signal LCLK. The input buffer circuit 25 receives write data, which are supplied via the data input/output terminal 14, and supplies the write data to the parallel/serial conversion circuit 26. The parallel/serial conversion circuit 26 converts parallel read data, which are supplied from the core chips CC0 to CC7 via the through silicon vias TSV, into serial data. The parallel/serial conversion circuit 26 also converts serial write data, which are supplied from the input buffer circuit 25, into parallel data. The FIFO circuit 27 receives serial read data, and supplies the serial read data to the output buffer circuit 24 at a desired timing under the control of a FIFO control circuit 28. The FIFO control circuit 28 supplies a timing signal FIFORS to the FIFO circuit 27 so that read data are output with a desired latency.

In that manner, between the parallel/serial conversion circuit 26 and the core chips CC0 to CC7, in principle, parallel data are input and output without being converted into serial data. In a typical, stand-alone SDRAM, data are input or output from or to the outside of the chip in a serial manner (i.e. there is one data input/output terminal for 1DQ). On the other hand, between the core chips CC0 to CC7 and the interface chip IF, data are input or output in a parallel manner. The feature described above is an important difference between the typical SDRAM and the core chips CC0 to CC7. However, it is unnecessary to input and output all pre-fetched parallel data using different through silicon vias TSV. It is also possible to reduce the number of through silicon vias TSV required for 1DQ by performing partial parallel/serial conversion in the core chips CC0 to CC7. As described below, according to the present embodiment, a process of transferring the read or write data between the interface chip IF and the core chips CC0 to CC7 is divided into two separate stages.

Figure 10:
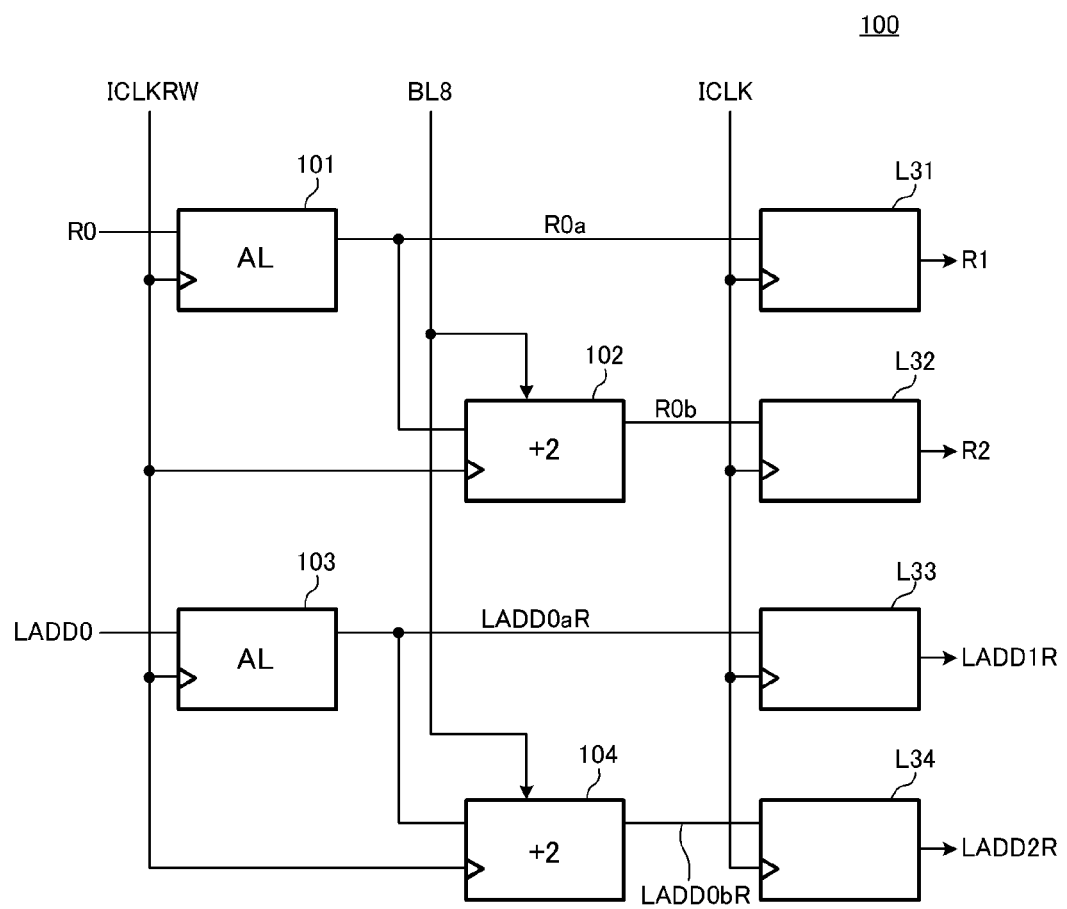
FIG. 10 is a circuit diagram showing a read control circuit 100.

FIG. 10 is a circuit diagram showing the read control circuit 100.

As shown in FIG. 10, the read control circuit 100 includes counter circuits 101 to 104, which perform a count operation in synchronization with the read/write clock signal ICLKRW, and latch circuits L31 to L34, which perform a latch operation in synchronization with the internal clock signal ICLK.

The counter circuit 101 counts additive latency AL. To an input node of the counter circuit 101, a read control signal R0 is supplied. Therefore, when the read control signal R0 is activated, the counter circuit 101 counts the additive latency AL in synchronization with the read/write clock signal ICLKRW, and then outputs a read control signal R0a. The read control signal R0a is latched by the latch circuit L31 and then output as a read control signal R1.

The counter circuit 102 further counts the read control signal R0a at a time when a burst length specification signal BL8 is being activated; a count value thereof is two. The burst length specification signal BL8 is a signal that is being activated when a burst length BL is eight, and is supplied from the mode register 32. When the burst length BL is any number other than eight (BL=4, for example), the counter circuit 102 is skipped. A read control signal R0b output from the counter circuit 102 is latched by the latch circuit L32 and output as a read control signal R2.

The counter circuits 103 and 104 are replicas of the counter circuits 101 and 102. The latch circuits L33 and L34 are replicas of the latch circuits L31 and L32. As shown in FIG. 10, to an input node of the counter circuit 103, a chip address LADD0 (P0 to P2) is supplied. Therefore, what is output from the latch circuit L33 is a chip address LADD1R, which is delayed by the counter circuit 103. What is output from the latch circuit L34 is a chip address LADD2R, which is delayed by the counter circuits 103 and 104.

As described above, the counter circuits 103 and 104 are replicas of the counter circuits 101 and 102, respectively. Therefore, the read control signal R1 and the chip address LADD1R are output at the same time. Moreover, the read control signal R2 and the chip address LADD2R are output at the same time. The count values of the counter circuits 101 to 104 can vary according to a set value of the mode register 32.

Figure 11:
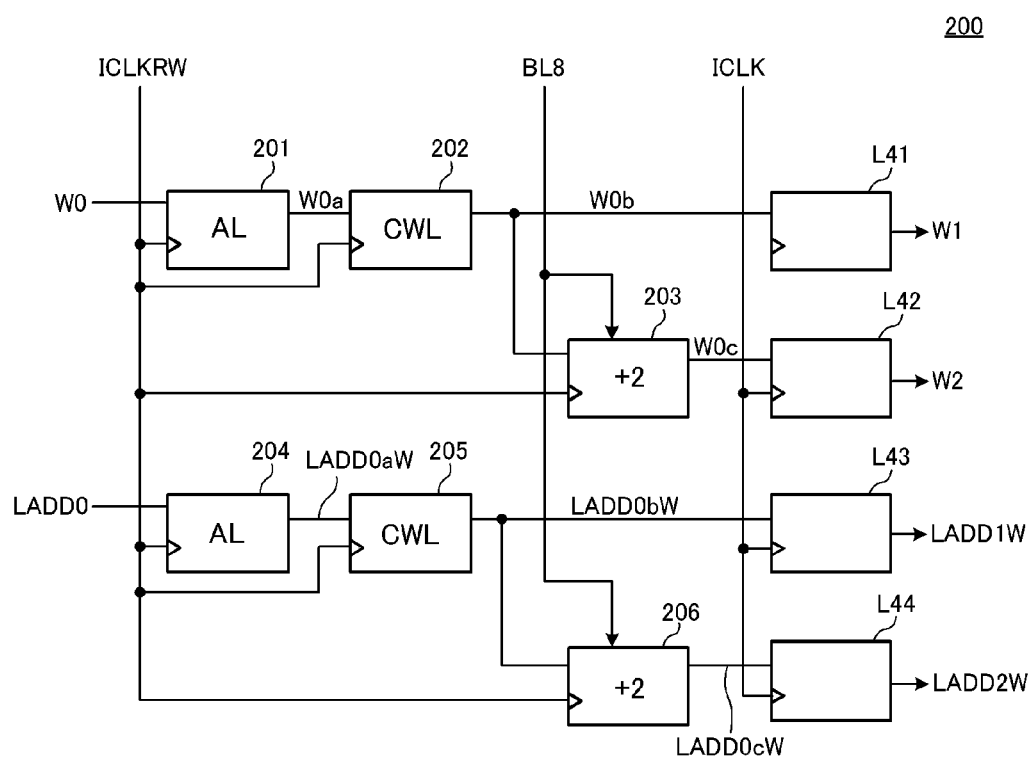
FIG. 11 is a circuit diagram showing a write control circuit 200.

FIG. 11 is a circuit diagram showing the write control circuit 200.

As shown in FIG. 11, the write control circuit 200 includes counter circuits 201 to 206, which perform a count operation in synchronization with the read/write clock signal ICLKRW, and latch circuits L41 to L44, which perform a latch operation in synchronization with the internal clock signal ICLK.

The counter circuit 201 counts additive latency AL. To an input node of the counter circuit 201, a write control signal W0 is supplied. Therefore, when the write control signal W0 is activated, the counter circuit 201 counts the additive latency AL in synchronization with the read/write clock signal ICLKRW, and then outputs a write control signal W0a. The counter circuit 202 counts CAS write latency CWL. To an input node of the counter circuit 202, the write control signal W0a is supplied. Therefore, when the write control signal W0a is activated, the counter circuit 202 counts the CAS write latency CWL in synchronization with the read/write clock signal ICLKRW, and then outputs a write control signal W0b. The write control signal W0b is latched by the latch circuit L41 and then output as a write control signal W1.

The counter circuit 203 further counts the write control signal W0b at a time when the burst length specification signal BL8 is being activated; a count value thereof is two. Therefore, when the burst length BL is any number other than eight (BL=4, for example), the counter circuit 203 is skipped. A write control signal W0c output from the counter circuit 203 is latched by the latch circuit L42 and output as a write control signal W2.

The counter circuits 204 to 206 are replicas of the counter circuits 201 to 203. The latch circuits L43 and L44 are replicas of the latch circuits L41 and L42. As shown in FIG. 11, to an input node of the counter circuit 204, a chip address LADD0 (P0 to P2) is supplied. Therefore, what is output from the latch circuit L43 is a chip address LADD1W, which is delayed by the counter circuits 204 and 205. What is output from the latch circuit L44 is a chip address LADD2W, which is delayed by the counter circuits 204 to 206.

As described above, the counter circuits 204 to 206 are replicas of the counter circuits 201 to 203, respectively. Therefore, the write control signal W1 and the chip address LADD1W are output at the same time. Moreover, the write control signal W2 and the chip address LADD2W are output at the same time. The count values of the counter circuits 201 to 206 can vary according to a set value of the mode register 32.

Figure 12:
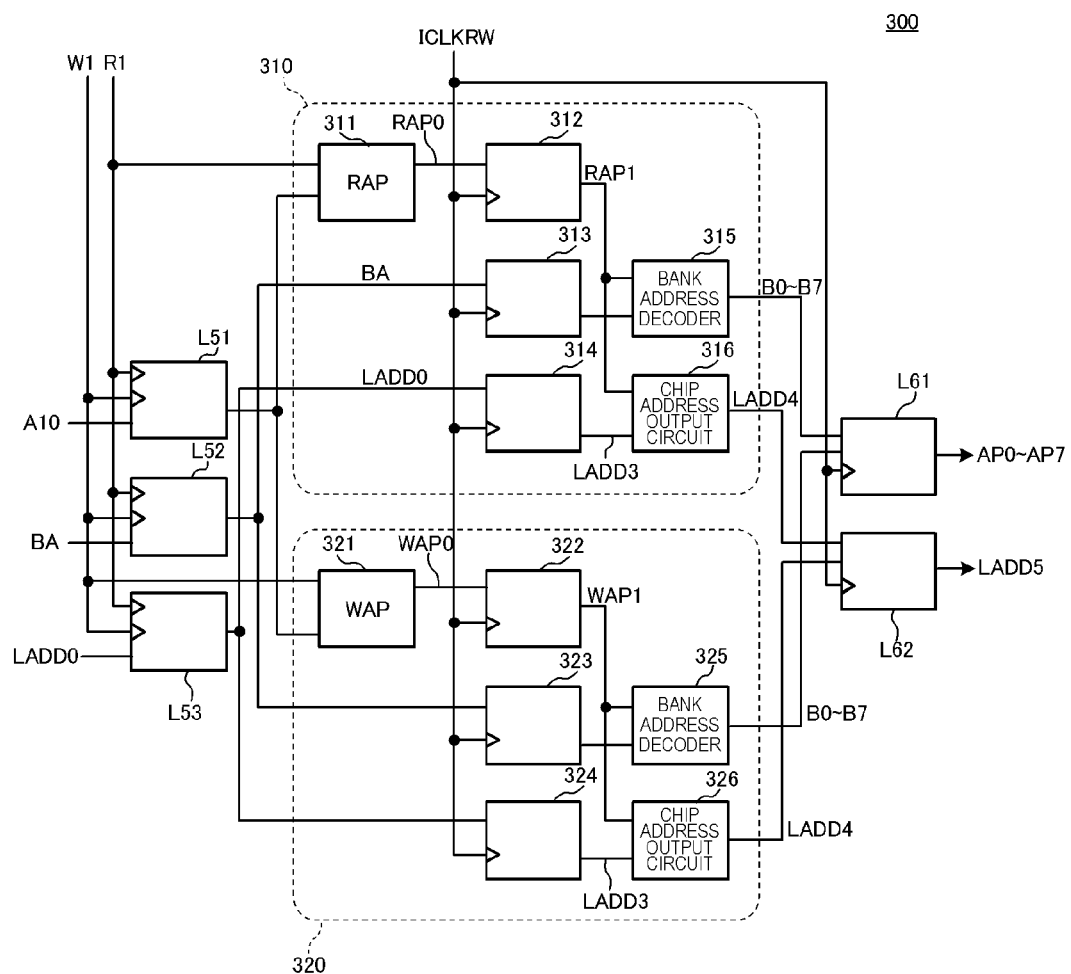
FIG. 12 is a circuit diagram showing an auto-precharge control circuit 300.

FIG. 12 is a circuit diagram showing the auto-precharge control circuit 300.

As shown in FIG. 12, the auto-precharge control circuit 300 includes a read auto-precharge control section 310 and a write auto-precharge control section 320. To the read auto-precharge control section 310 and the write auto-precharge control section 320, outputs of latch circuits L51 to L53 are supplied. The latch circuits L51 to L53 latch the address signal A10, bank address signals BA0 to BA2 and chip address LADD0, respectively, in response to the read control signal R1 or write control signal W1. The address signal A10 specifies whether or not there is an auto-precharge operation, and is input in synchronization with the read command RD or write command WR at the same time as other address signals ADD are input. When the address signal A10 is at a high level, the auto-precharge operation is performed after a read operation or write operation. When the address signal A10 is at a low level, the auto-precharge operation is not performed. It is necessary to issue a pre-charge command after a read operation or write operation.

The read auto-precharge control section 310 includes a read auto-precharge activation circuit 311, counter circuits 312 to 314, a bank address decoder 315, and a chip address output circuit 316. The read auto-precharge activation circuit 311 receives an output of the latch circuit L51 and the read control signal R1. When the output of the latch circuit L51 and the read control signal R1 are both being activated, the read auto-precharge activation circuit 311 generates a read auto-precharge signal RAP0. The read auto-precharge signal RAP0 is delayed by a count operation of the counter circuit 312 and then output as a read auto-precharge signal RAP1. The read auto-precharge signal RAP1 is supplied to the bank address decoder 315 and the chip address output circuit 316.

The count operation of the counter circuit 312 is performed in synchronization with the read/write clock signal ICLKRW. A count value of the counter circuit 312 for the read/write clock signal ICLKRW is four. The counter circuits 313 and 314 are replicas of the counter circuit 312. Therefore, count operations of the counter circuits 313 and 314 are performed in synchronization with the read/write clock signal ICLKRW. The count values of the counter circuits 313 and 314 are set to the same value as that of the counter circuit 312.

As shown in FIG. 12, to the counter circuit 313, a bank address signal BA (BA0 to BA2) is supplied from the latch circuit L52. Therefore, an output timing of the bank address signal BA output from the counter circuit 313 is in synchronization with the read auto-precharge signal RAP1. Moreover, to the counter circuit 314, a chip address LADD0 is supplied from the latch circuit L53. Therefore, an output timing of a chip address LADD3 output from the counter circuit 314 is in synchronization with the read auto-precharge signal RAP1.

The bank address decoder 315 decodes the bank address signal BA in response to the activation of the read auto-precharge signal RAP1. The decoding results, i.e. bank specification signals B0 to B7, are latched by a latch circuit L61 in synchronization with the read/write clock signal ICLKRW, and then output as auto-precharge signals AP0 to AP7, respectively. The chip address output circuit 316 captures the chip address LADD3 in response to the activation of the read auto-precharge signal RAPT, and then outputs the chip address LADD3 as a chip address LADD4. An output timing of the chip address LADD4 is so designed as to be in synchronization with an output timing of the bank specification signals B0 to B7 by the bank address decoder 315. The chip address LADD4 is latched by a latch circuit L62 in synchronization with the read/write clock signal ICLKRW, and then output as a chip address LADD5.

According to the above configuration, when auto-precharge is specified at a time when the read command RD is issued (A10=H), auto-precharge signals AP0 to AP7 are output after a count operation of the counter circuit 101, which is included in the read control circuit 100, and a count operation of the counter circuit 312, which is included in the read auto-precharge control section 310, are completed. At the same time, a chip address LADD5 is also output.

As shown in FIG. 12, the circuit configuration of the write auto-precharge control section 320 is similar to that of the read auto-precharge control section 310. The write auto-precharge control section 320 is different from the read auto-precharge control section 310 in that instead of the read control signal R1, the write control signal W1 is supplied. Moreover, a count value of a counter circuit 322 can vary according to a set value of the mode register 32. According to the above configuration, when the write control signal W1 is activated, a write auto-precharge signal WAP0 is activated by a write auto-precharge activation circuit 321 and then supplied to the counter circuit 322. A write auto-precharge signal WAP1 output from the counter circuit 322 is supplied to a bank address decoder 325 and a chip address output circuit 326 to activate the bank address decoder 325 and the chip address output circuit 326. The bank address decoder 325 decodes a bank address signal BA output from a counter circuit 323 to generate bank specification signals B0 to B7. The bank specification signals B0 to B7 are input into the latch circuit L61. The chip address output circuit 326 receives a chip address LADD3, which is output from a counter circuit 324, and then outputs the chip address LADD3 as a chip address LADD4. The chip address LADD4 is input into the latch circuit L62.

According to the above configuration, when auto-precharge is specified at a time when the write command WR is issued (A10=H), auto-precharge signals AP0 to AP7 are output after a count operation of the counter circuit 201, which is included in the write control circuit 200, and a count operation of the counter circuit 322, which is included in the write auto-precharge control section 320, are completed. At the same time, a chip address LADD5 is also output.

The above has outlined the interface chip IF. The outputs of the read control circuit 100, write control circuit 200 and auto-precharge control circuit 300 described above are supplied to the core chips CC0 to CC7 via the through silicon vias TSV as shown in FIG. 8. The same is true for address signals. Incidentally, the through silicon vias shown in FIG. 8 are through silicon vias TSV1 of a type shown in FIG. 2A. Therefore, a signal output from the interface chip IF via the through silicon vias TSV1 is commonly supplied to all the core chips CC0 to CC7. The following describes the circuit configuration of the core chips CC0 to CC7.

FIG. 9 is a circuit diagram showing the core chip CC0. The core chips CC0 to CC7 have the same circuit configuration. Therefore, in FIG. 9, only the configuration of the core chip CC0 is shown on behalf of the other core chips.

As shown in FIG. 9, a memory cell array 50, which is included in the core chip CC0, is divided into eight banks. Incidentally, banks are units that can accept commands separately. In other words, the banks can each operate non-exclusively and independently of each other. In the memory cell array 50, a plurality of word lines WL and a plurality of bit lines BIL cross each other. At the points where the word lines WL and the bit lines BIL cross each other, memory cells MC are disposed (In the case of FIG. 9, only one word line WL, one bit line BIL and one memory cell MC are shown). A word line WL is selected by a row decoder 61. The selected word line WL is driven by a word driver 51. Moreover, the bit lines BIL are connected to corresponding sense amplifiers in a sense circuit 53. A sense amplifier is selected by a column decoder 62. A column switch 52 connects the selected sense amplifier to a data amplifier 70.

To the row decoder 61, a row address RA is supplied via a row address latch circuit 63. The row address latch circuit 63 latches, in response to the activation of a matching signal HIT1 output from a judgment circuit 71, an address signal ADD, which is supplied via a through silicon via TSV. Besides the above circuits, a circuit block used for row access may be referred to as a "row access circuit." To the column decoder 62, a column address CA is supplied via a column address latch circuit 64. The column address latch circuit 64 latches, in response to the activation of a matching signal HIT2 output from a judgment circuit 72, an address signal ADD, which is supplied via a through silicon via TSV. Besides the above circuits, a circuit block used for column access may be referred to as a "column access circuit."

The judgment circuits 71 and 72 compare a chip address LADD0, which is supplied from the interface chip IF via the through silicon via TSV, with a unique chip addresses LID, which is assigned to the core chips CC0 to CC7. When both match with each other, the matching signals HIT1 and HIT2 are activated. A chip address LID is held by a chip address holding circuit 65. The chip address holding circuits 65 are connected in cascade among the core chips CC0 to CC7 via the through silicon vias TSV2 of a type shown in FIG. 2B. Accordingly, a different chip address LID is set in each of the core chips CC0 to CC7.

Moreover, according to the present embodiment, judgment circuits 73 to 77 are provided in the core chips CC0 to CC7. The judgment circuits 73 to 77 compare chip addresses LID, which are held by the chip address holding circuits 65, with chip addresses LADD1R, LADD2R, LADD1W, LADD2W and LADD5, which are supplied from the interface chip IF via the through silicon vias TSV, respectively. When both match with each other, matching signals HIT3 to HIT7 are activated. Among the above matching signals, the matching signals HIT3 to HIT6 are supplied to a column switch control circuit 41 and a data amplifier control circuit 42 to control operating timings of the column switch control circuit 41 and the data amplifier control circuit 42. The matching signal HIT7 is supplied to the word driver 51, the sense circuit 53 and the like to control a pre-charge timing of the memory cell array 50.

The above has described the basic circuit configuration of the core chips CC0 to CC7.

The following describes, as an example, the case where the PRA system is selected for an operation of the semiconductor device 10 according to the present embodiment.

Figure 13:
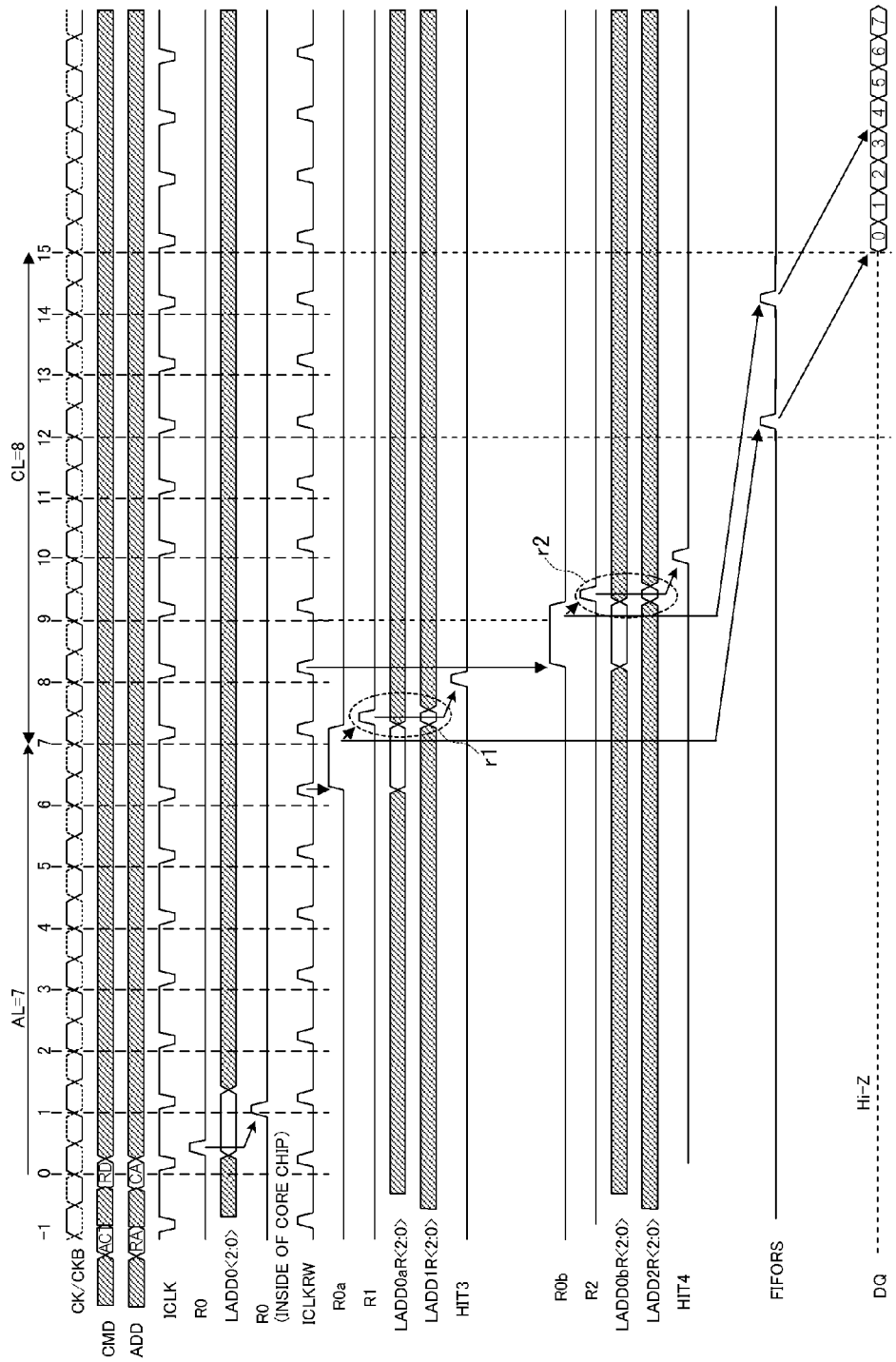
FIG. 13 is a timing chart illustrating a read operation.

FIG. 13 is a timing chart illustrating a read operation.

In the example shown in FIG. 13, in synchronization with active edge −1 of an external clock signal CK, an active command ACT is issued, and a row address RA is also input. The row address contains a chip address LADD and a bank address BA. The command decoder 31 generates an active control signal IACT in response to the active command ACT, and supplies the active control signal IACT to the latch circuit L10. The active control signal IACT latched by the latch circuit L10 is supplied to each of the core chips CC0 to CC7 via the through silicon vias TSV. The row address is also supplied to each of the core chips CC0 to CC7. As described above, the row address contains the chip address and the bank address. Therefore, a bank specified by the bank address BA in a core chip specified by the chip address LADD becomes activated.

Then, in synchronization with active edge 0 of the external clock signal CK, a read command RD is issued, and a column address CA is also input. According to the PRA system, the column address contains a chip address LADD and a bank address BA. The command decoder 31 generates a read control signal R0 in response to the read command RD, and supplies the read control signal R0 to the latch circuit L11. The read control signal R0 latched by the latch circuit L11 is supplied to the read control circuit 100. The column address CA is also supplied to each of the core chips CC0 to CC7. The chip address LADD, which is contained in the column address CA, is supplied to the read control circuit 100 via the latch circuit L21.

As shown in FIG. 13, in the present example, the value of the additive latency AL is seven. That is, the issuing timing of the read command RD comes seven clock cycles ahead of the original timing, meaning that the count values of the counter circuits 101 and 103 shown in FIG. 10 are set to seven. Therefore, the read control signal R0, which is generated in response to the issuing of the read command RD, is delayed by seven clock cycles, and then output as a read control signal R1 in synchronization with the internal clock signal ICLK. Moreover, in the present example, the count values of the counter circuits 102 and 104 shown in FIG. 10 are set to two. When the burst length BL is set to eight, a read control signal R2 is activated two clock cycles after the activation of the read control signal R1.

As indicated by reference symbol r1, the activation timing of the read control signal R1 is in synchronization with the output timing of a chip address LADD1R. Therefore, to each of the core chips CC0 to CC7, the chip address LADD1R is supplied in synchronization with the read control signal R1. As a result, among the core chips CC0 to CC7, only the judgment circuit 73 in a core chip specified by the chip address LADD1R activates the matching signal HIT3. In synchronization with the activation of the matching signal HIT3, the column switch control circuit 41 activates a column switch 52, and outputs read data, which are amplified by a sense amplifier, to a data bus DB. The data bus DB is a line connecting the column switch 52 to the data amplifier 70.

As a result, on the data bus DB, all read data pre-fetched from the memory cell array 50 appear. The data amplifier control circuit 42 activated by the matching signal HIT3 activates the data amplifier 70 corresponding to half of the read data, which are then output to the interface chip IF via the through silicon vias TSV.

Moreover, as indicated by reference symbol r2, the activation timing of the read control signal R2 is in synchronization with the output timing of a chip address LADD2R. Therefore, to each of the core chips CC0 to CC7, the chip address LADD2R is supplied in synchronization with the read control signal R2. As a result, among the core chips CC0 to CC7, only the judgment circuit 74 in a core chip specified by the chip address LADD2R activates the matching signal HIT4. The data amplifier control circuit 42 activated by the matching signal HIT4 activates the data amplifier 70 corresponding to the remaining half of the read data, which are then output to the interface chip IF via the through silicon vias TSV.

The read data that are transferred in two stages as described above are sequentially converted into serial data by the parallel/serial conversion circuit 26 in the interface chip IF, and then transferred to the FIFO circuit 27. The FIFO control circuit 28, which controls an operation of the FIFO circuit 27, activates a timing signal FIFORS once on the basis of the read control signal R1, thereby controlling the output timing of the first read data transferred. The FIFO control circuit 28 activates the timing signal FIFORS one more time on the basis of the read control signal R2, thereby controlling the output timing of the second read data transferred. As a result, from the data input/output terminal 14, all the read data DQ are output in the form of serial data. In the example shown in FIG. 13, the value of the CAS latency CL is eight. Accordingly, a process of outputting read data starts 15 clock cycles (=AL+CL) after the read command RD is issued.

In that manner, the read control signal R0 is delayed in the interface chip IF to generate the read control signals R1 and R2. In synchronization with the read control signals R1 and R2, the chip addresses LADD1R and LADD2R are each supplied to the core chips CC0 to CC7. Therefore, it is unnecessary to control latency in the core chips CC to CC7. Thus, it is unnecessary to provide a latency counter or the like in the core chips CC0 to CC7, as well as to supply the internal clock signal ICLK to the core chips CC0 to CC7 from the interface chip IF.

Figure 14:
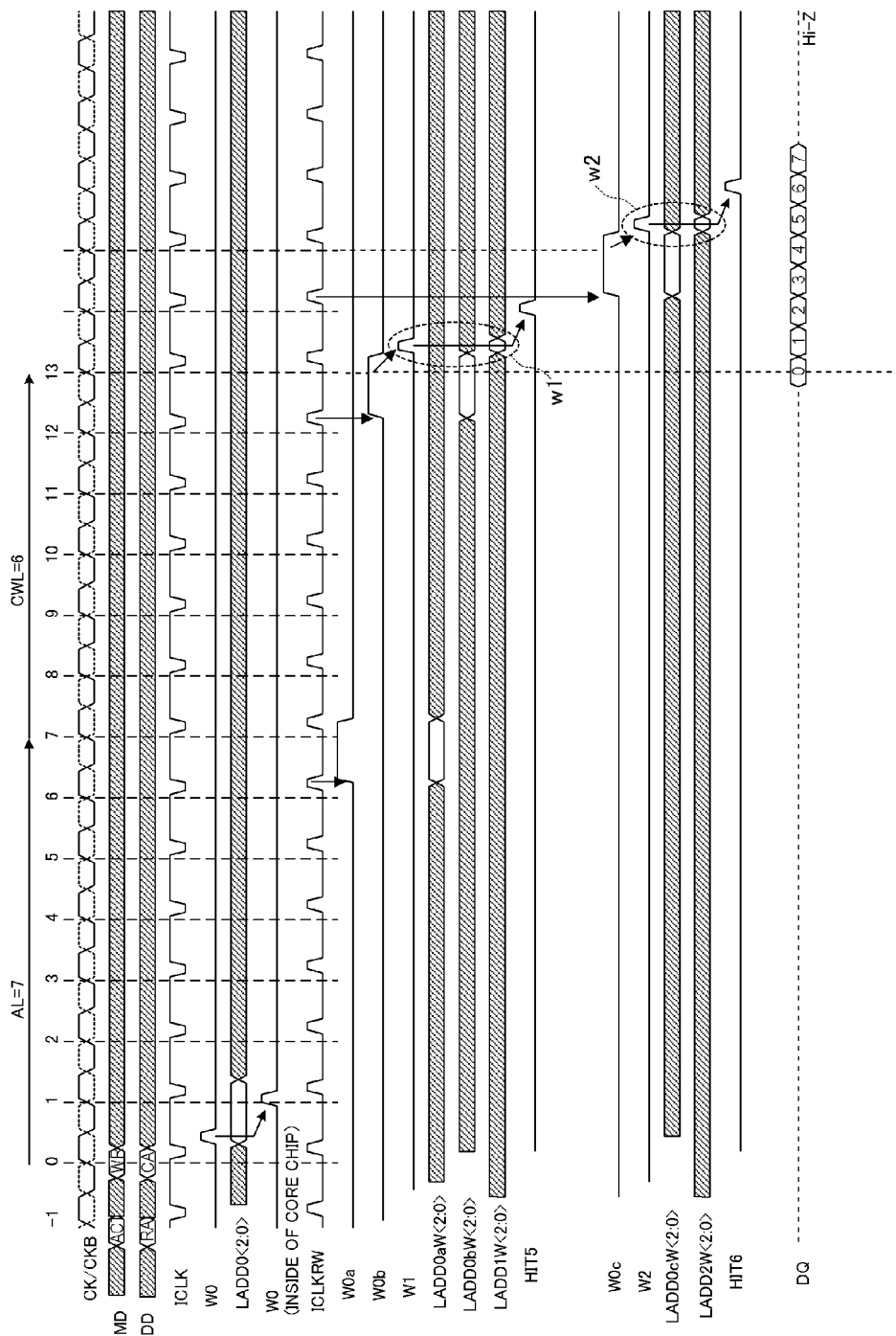
FIG. 14 is a timing chart illustrating a write operation.

FIG. 14 is a timing chart illustrating a write operation.

In the example shown in FIG. 14, in synchronization with active edge −1 of an external clock signal CK, an active command ACT is issued, and a row address RA is also input. Moreover, in synchronization with active edge 0 of the external clock signal CK, a write command WR is issued, and a column address CA is also input.

As shown in FIG. 14, in the present example, the value of the additive latency AL is seven, and the value of the CAS write latency CWL is six, meaning that the count value of the counter circuit 201 shown in FIG. 11 is set to seven (=AL), and the count value of the counter circuit 202 is set to six (=CWL). Therefore, the write control signal W0 that is generated in response to the issuing of the write command WR is delayed by 13 clock cycles and then output as a write control signal W1 in synchronization with the internal clock signal ICLK. Moreover, in the present example, when the count values of the counter circuits 203 and 206 shown in FIG. 11 are set to 2 and the burst length BL to eight, a write control signal W2 is activated two clock cycles after the write control signal W1 is activated.

As indicated by reference symbol w1, the activation timing of the write control signal W1 is in synchronization with the output timing of a chip address LADD1W. Therefore, to each of the core chips CC0 to CC7, the chip address LADD1W is supplied in synchronization with the write control signal W1. As a result, among the core chips CC0 to CC7, only the judgment circuit 75 in a core chip specified by the chip address LADD1W activates the matching signal HIT5. In synchronization with the activation of the matching signal HIT5, the data amplifier 70 is activated, outputting 4-bit write data, which are the first half of write data transferred from the interface chip IF in a parallel manner, to the data bus DB.

Moreover, as indicated by reference symbol w2, the activation timing of the write control signal W2 is in synchronization with the output timing of a chip address LADD2W. Therefore, to each of the core chips CC0 to CC7, the chip address LADD2W is supplied in synchronization with the write control signal W2. As a result, among the core chips CC0 to CC7, only the judgment circuit 76 in a core chip specified by the chip address LADD2W activates the matching signal HIT6. In synchronization with the activation of the matching signal HIT6, the data amplifier 70 is activated, outputting 4-bit write data, which are the second half of write data transferred from the interface chip IF in a parallel manner, to the data bus DB.

As a result, on the data bus DB, all write data transferred from the interface chip IF appear. Then, in synchronization with the matching signal HIT6, the column switch control circuit 41 is activated, and the write data are written in a parallel manner into the memory cell array 50.

In that manner, according to the present embodiment, even the latency control needed for the write operation is performed inside the interface chip IF. Therefore, as described above, it is unnecessary to provide a latency counter or the like in the core chips CC0 to CC7, as well as to supply the internal clock signal ICLK to the core chips CC0 to CC7 from the interface chip IF.

Figure 15:
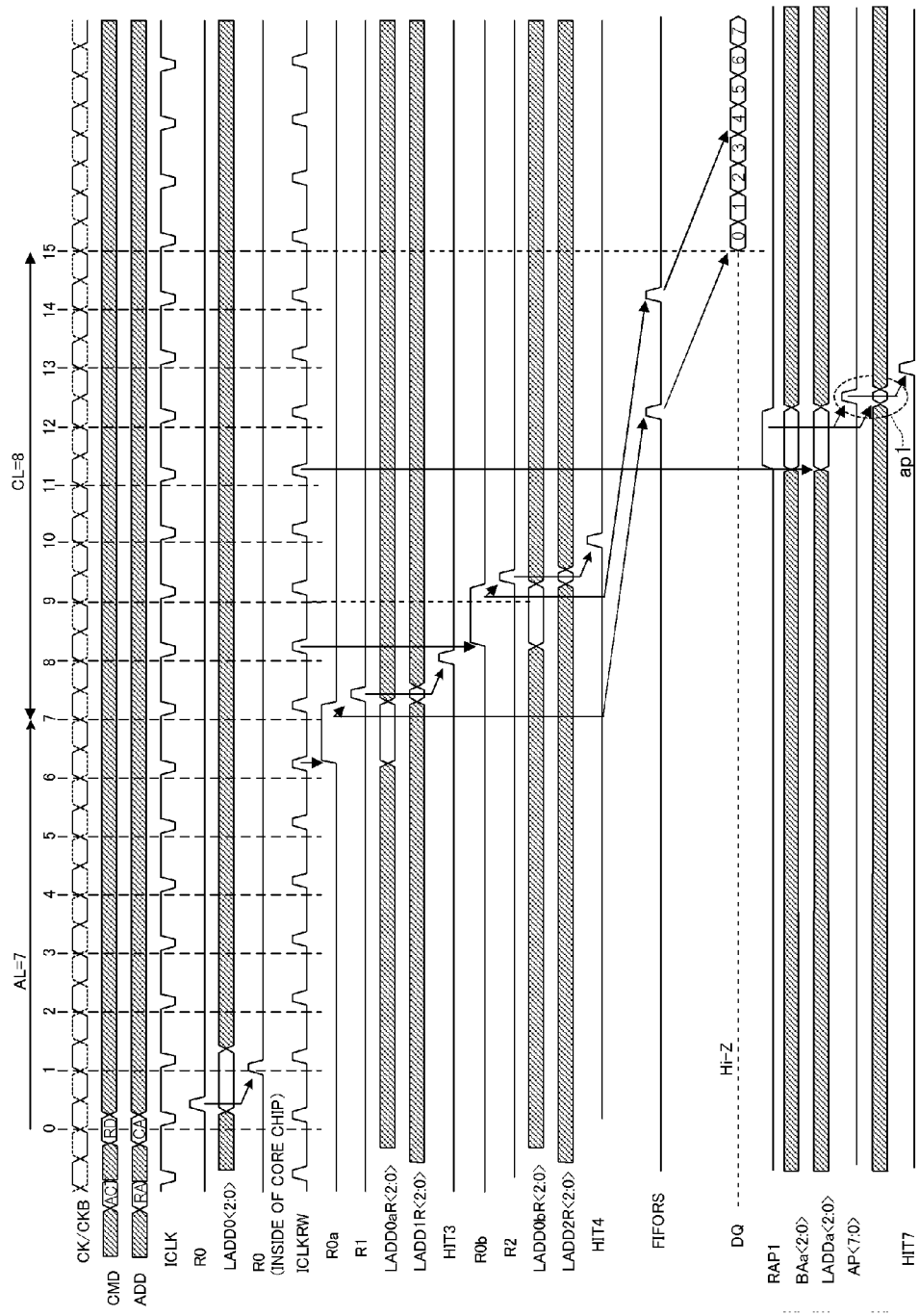
FIG. 15 is a timing chart illustrating an auto-precharge operation.

FIG. 15 is a timing chart illustrating an auto-precharge operation.

What is shown in FIG. 15 is an example in which an auto-precharge operation takes place after a read operation. The read operation has been described with reference to FIG. 13. In the example shown in FIG. 15, after a lapse of four clock cycles from the read control signal R1 is activated, a read auto-precharge signal RAP1 is activated, meaning that the count value of the counter circuit 312 is set to four. After that, in synchronization with the read/write clock signal ICLKRW, any one of auto-precharge signals AP0 to AP7 specified by a bank address BA is activated and then supplied to the core chips CC0 to CC7.

As indicated by reference symbol apl, the activation timing of the auto-precharge signals AP0 to AP7 is in synchronization with the output timing of a chip address LADD5. Therefore, to each of the core chips CC0 to CC7, the chip address LADD5 is supplied in synchronization with the auto-precharge signals AP0 to AP7. As a result, among the core chips CC0 to CC7, only the judgment circuit 77 in a core chip specified by the chip address LADD5 activates the matching signal HIT7. As a result, the banks specified by the auto-precharge signals AP0 to AP7 in the core chip are precharged.

In that manner, according to the present embodiment, even the delay operation needed for the pre-charge operation is performed inside the interface chip IF. Therefore, as described above, it is unnecessary to provide a delay circuit or the like in the core chips CC0 to CC7, as well as to supply the internal clock signal ICLK to the core chips CC0 to CC7 from the interface chip IF.

It is apparent that the present invention is not limited to the above embodiments, but may be modified and changed without departing from the scope and spirit of the invention.

Figure 16:
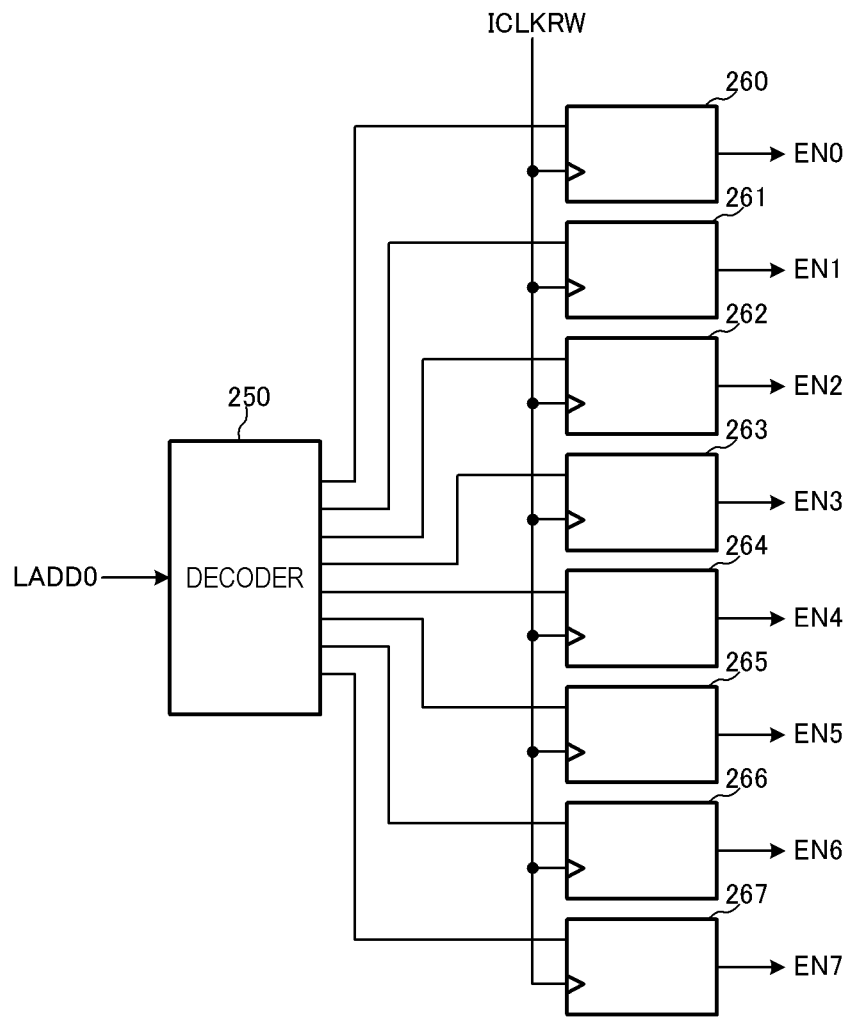
FIG. 16 is a block diagram showing a modified example.
Figure 17:
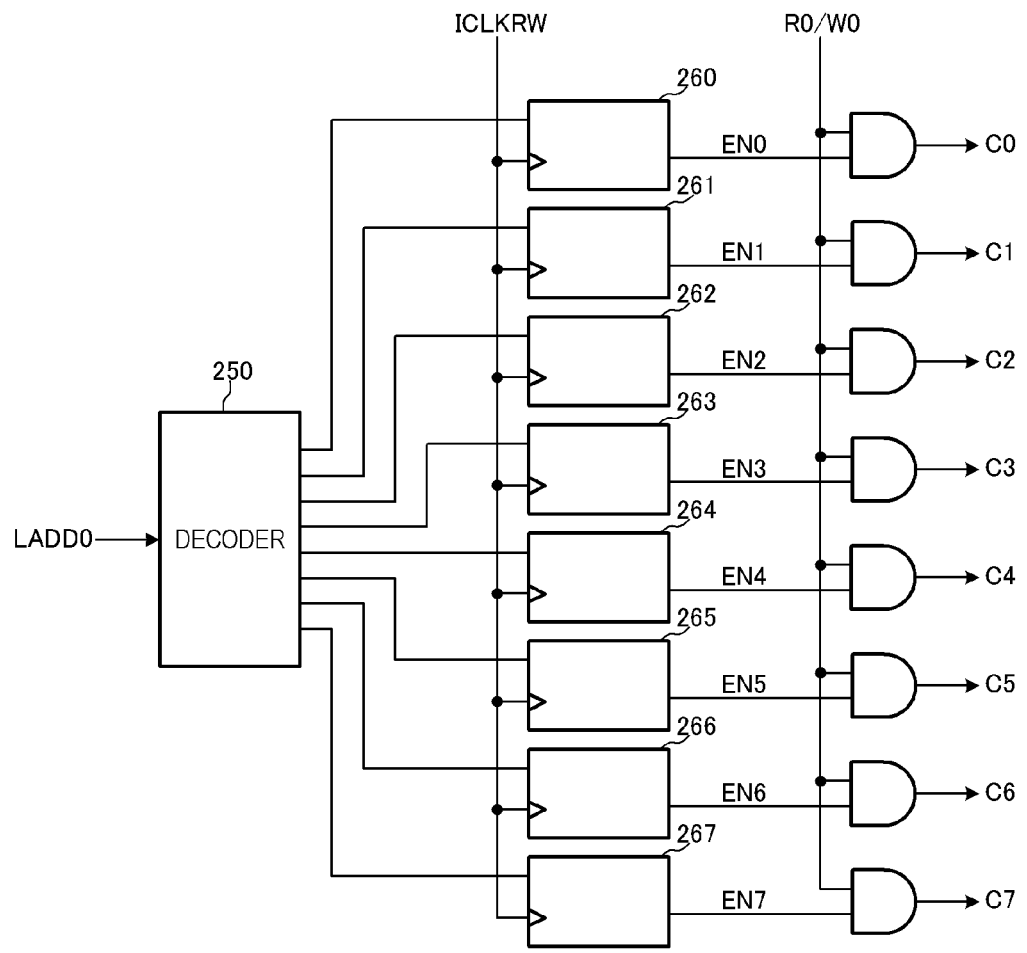
FIG. 17 is a block diagram showing another modified example.

For example, according to the above embodiment, an operation of decoding a chip address LADD is performed in the core chips CC0 to CC7. However, an operation of decoding a chip address LADD may be performed inside the interface chip IF. In this case, as shown in FIG. 16, a decoder 250 and counter circuits 260 to 267, which become replicas, are provided; enable signals EN0 to EN7, which are output from the counter circuits 260 to 267, are supplied to the core chips CC0 to CC7. In this case, if the enable signals EN0 to EN7 are transferred to the core chips CC0 to CC7 with the use of the through silicon vias TSV3 of a type shown in FIG. 2C, it is unnecessary to provide a judgment circuit in the core chips CC0 to CC7. Furthermore, as shown in FIG. 17, if commands C0 to C7 are generated by calculating the logical products of the enable signals EN0 to EN7 and an internal control signal, and then transferred to the core chips CC0 to CC7 with the use of the through silicon vias TSV3 of a type shown in FIG. 2C, it is possible to selectively supply a command only to a core chip that carries out a column operation.

Figure 18:
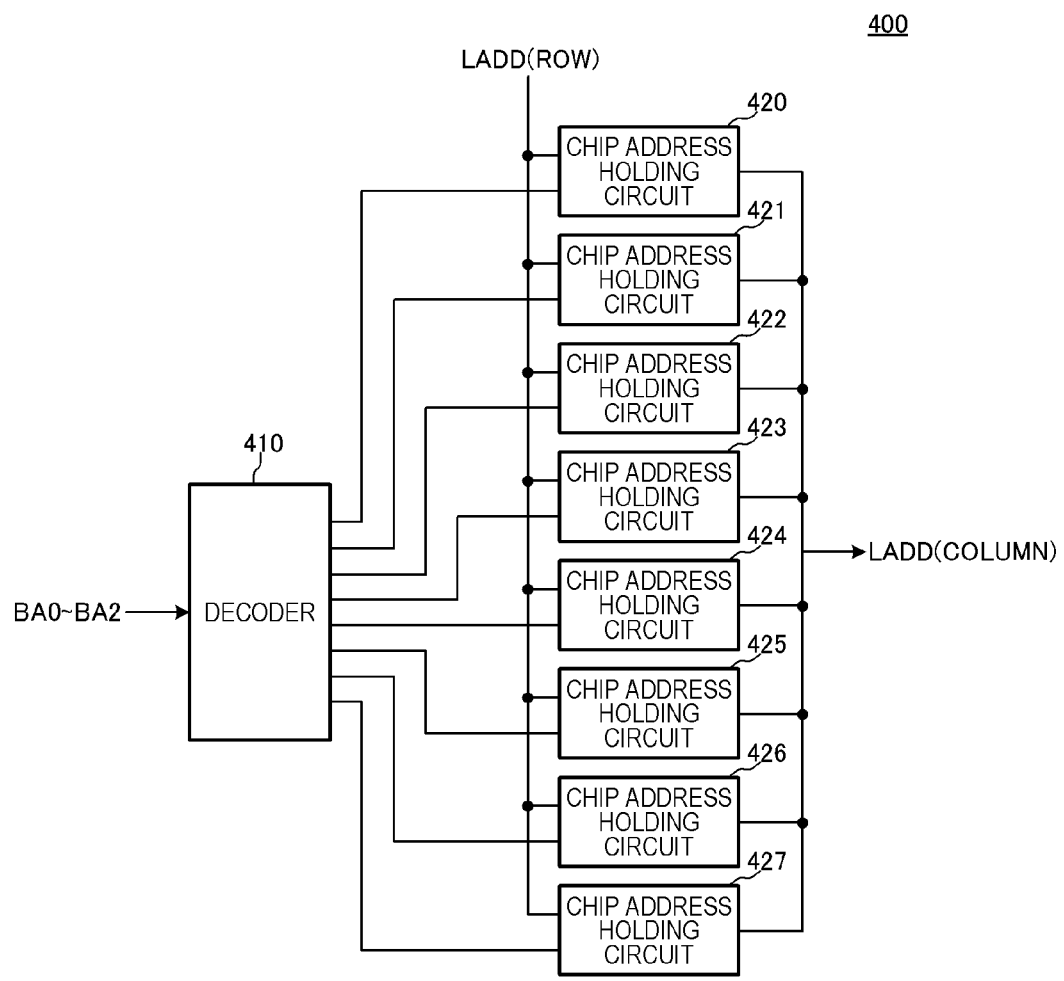
FIG. 18 is a block diagram showing a chip address generation circuit 400.

Moreover, according to the above embodiment, the example in which the PRA system is selected has been described. However, the present invention can be applied to the case where the LRA system is selected. According to the LRA system, no chip address LADD is supplied when a column command is issued. However, a chip address LADD can be generated from a bank address BA. For example, when the address assignment of the LRA-1 system shown in FIG. 4 is selected, it is possible to identify a chip address LADD on the basis of a bank address BA that is supplied when a column command is issued, because one core chip in each bank is active. That is, as shown in FIG. 18, all that is required is as follows: a chip address generation circuit 400 including a decoder 410, which decodes a bank address BA, and chip address holding circuits 420 to 427, which hold a chip address for each bank, is provided in the interface chip IF; a chip address LADD (ROW), which is specified when an active command ACT is issued, is held by the chip address holding circuits 420 to 427 corresponding to a specified bank. Then, on the basis of a bank address BA that is supplied when a column command is issued, the chip address is read out from the corresponding chip address holding circuits 420 to 427. Therefore, even in the LRA system, it is possible to acquire a chip address LADD (COLUMN) at a time when a column command is issued.

Moreover, according to the present invention, an output timing of an internal control signal (which is for example a read control signal R1) that is delayed in the interface chip IF does not necessarily come at the same time as an output timing of a corresponding chip address (which is for example a chip address LADD1R). There can be a difference between the output timings of the internal control signal and chip address, as long as both are in synchronization with each other and therefore associated with each other when being processed in the core chips CC0 to CC7.

What is claimed is:

1. A semiconductor device comprising,
a first chip including a timing control circuit that outputs, in response to a first command signal and a clock signal supplied from outside, a plurality of second command signals having different timings from each other in synchronization with the clock signal; and
a second chip stacked on the first chip including a plurality of internal circuits, each of the internal circuits performing an operation indicated by the first command signal in synchronization with corresponding one of the second command signals,
wherein the clock signal is not supplied from the first chip to the second chip.

2. The semiconductor device as claimed in claim 1, wherein the first chip includes a plurality of first through silicon vias penetrating the first chip, the second chip including a plurality of second through silicon vias penetrating the second chip, and the second command signals being transferred from the first through silicon vias to the second through silicon vias, respectively.

3. A semiconductor device comprising,
a first chip including a timing control circuit that outputs, in response to a first command signal and a clock signal supplied from outside, a plurality of second command signals having different timings from each other in synchronization with the clock signal; and
a second chip stacked on the first chip including a plurality of internal circuits, each of the internal circuits performing an operation indicated by the first command signal in synchronization with corresponding one of the second command signals, wherein
the second chip further includes a memory cell array and a data bus,
the internal circuits include a column switch which connects the memory cell array and the data bus based on an address signal, and a data amplifier which amplifies data on the data bus, and
each of the column switch and the data amplifier is activated in synchronization with corresponding one of the second command signals.

4. The semiconductor device as claimed in claim 3, wherein the memory cell array performs a pre-charge operation in synchronization with one of the second command signals.

5. A semiconductor device comprising,
a first chip including a timing control circuit that outputs, in response to a first command signal and a clock signal supplied from outside, a plurality of second command signals having different timings from each other in synchronization with the clock signal; and
a second chip stacked on the first chip including a plurality of internal circuits, each of the internal circuits performing an operation indicated by the first command signal in synchronization with corresponding one of the second command signals, wherein
a plurality of the second chips are provided,
the first chip commonly supplies the second command signals to the second chips,
the first chip commonly supplies a first chip address identifying one of the second chips to the second chips in synchronization with each of the second command signals, and
the internal circuits are activated when the first chip address matches a second chip address assigned to each of the second chips.

6. A semiconductor device comprising,
a first chip including a timing control circuit that outputs, in response to a first command signal and a clock signal supplied from outside, a plurality of second command signals having different timings from each other in synchronization with the clock signal; and a second chip stacked on the first chip including a plurality of internal circuits, each of the internal circuits performing an operation indicated by the first command signal in synchronization with corresponding one of the second command signals, wherein
the first chip further includes a FIFO circuit that outputs read data supplied from the second chips to the outside in response to at least one of the second command signals.

7. A semiconductor device, comprising:
an interface chip to which an address signal and a first command signal are supplied from outside; and
a plurality of core chips to which different chip addresses are assigned, respectively, wherein
the interface chip includes a first command delay circuit generating a second command signal by delaying the first command signal, and a first chip address delay circuit generating a second chip address by delaying a first chip address, the interface chip commonly supplying the second command signal and the second chip address to the core chips, and each of the core chips includes a first judgment circuit activating a first matching signal when the second chip address matches a chip address assigned to the core chips, and a first internal circuit performing an operation in synchronization with the second command signal when the first matching signal is activated.

8. The semiconductor device as claimed in claim 7, wherein each of the core chips further includes a memory cell array, a row access circuit performing a row access to the memory cell array, and a column access circuit performing a column access to the memory cell array, the first command signal is issued when the column access is to be performed, and the first internal circuit is included in the column access circuit.

9. The semiconductor device as claimed in claim 8, wherein the interface chip further includes a second command delay circuit generating a third command signal that is activated at a later timing than the second command signal by delaying one of the first and second command signal, and a second chip address delay circuit generating a third chip address that is activated at a later timing than the second chip address by delaying one of the first and second chip addresses, the interface chip commonly supplying the third command signal and the third chip address to the core chips, each of the core chips further includes a second judgment circuit activating a second matching signal when the third chip address matches a chip address assigned to the core chips, and a second internal circuit performing an operation in synchronization with the third command signal when the second matching signal is activated, the first internal circuit includes at least one of a column switch and a data amplifier included in the column access circuit, and the second internal circuit includes at least other of the column switch and the data amplifier included in the column access circuit.

10. The semiconductor device as claimed in claim 9, wherein each of the core chips activates the column switch in response to the second command signal and activates the data amplifier in response to the third command signal to output read data read out from the memory cell array to the interface chip when the first command signal indicates a read operation.

11. The semiconductor device as claimed in claim 9, wherein each of the core chips activates the data amplifier in response to the second command signal and activates the column switch in response to the third command signal to store write data supplied from the interface chip into the memory cell array when the first command signal indicates a write operation.

12. The semiconductor device as claimed in claim 9, wherein the interface chip further includes a third command delay circuit generating a fourth command signal by delaying any one of the first to third command signals, and a third chip address delay circuit generating a fourth chip address by delaying any one of the first to third chip addresses, the interface chip commonly supplying the fourth command signal and the fourth chip address to the core chips, and each of the core chips further includes a third judgment circuit activating a third matching signal when the fourth chip address matches a chip address assigned to the core chips, and a third internal circuit performing a precharge operation of the memory cell array in synchronization with the fourth command signal when the third matching signal is activated.

13. The semiconductor device as claimed in claim 7, wherein the first chip address is part of the address signal supplied from the outside in synchronization with the first command signal.

14. The semiconductor device as claimed in claim 7, wherein the interface chip further includes a chip address generation circuit that generates the first chip address based on part of the address signal supplied from the outside in synchronization with the first command signal.

15. The semiconductor device as claimed in claim 14, wherein the chip address generation circuit generates the first chip address based on a bank address included in the address signal.

16. The semiconductor device as claimed in claim 7, wherein the interface chip and the core chips are stacked on each other, and are electrically connected together via through silicon vias provided at least in the core chips.

17. The semiconductor device as claimed in claim 7, wherein the interface chip is supplied with an external clock signal from outside and further includes a clock generation circuit outputting an internal clock signal in response to the external clock signal, and both the second command signal and the second chip address synchronize with the internal clock signal.

18. The semiconductor device as claimed in claim 17, wherein each of the core chips is not supplied with the external clock signal and the internal clock signal.

19. The semiconductor device as claimed in claim 7, wherein the interface chip further includes first and second through silicon vias, each of the core chips further includes third and fourth through silicon vias respectively corresponding to the first and second through silicon vias, the second command signal is transferred from first through silicon via to each of the third through silicon vias, and the second chip address is transferred from second through silicon via to each of the fourth through silicon vias.

* * * * *